United States Patent [19]
Tracewell

[11] Patent Number: 5,168,171
[45] Date of Patent: Dec. 1, 1992

[54] ENCLOSURE FOR CIRCUIT MODULES
[76] Inventor: Larry L. Tracewell, 8653 Finlarig Dr., Dublin, Ohio 43017
[21] Appl. No.: 663,561
[22] Filed: Mar. 4, 1991
[51] Int. Cl.$^5$ .............................................. H02J 9/00
[52] U.S. Cl. ...................................... 307/64; 307/66; 307/150; 340/606; 340/660; 361/384
[58] Field of Search ............... 340/606, 660, 661, 662, 340/663; 361/383, 384, 415; 165/13; 395/750; 307/64, 66, 149, 150

[56] References Cited
U.S. PATENT DOCUMENTS

| 4,609,829 | 9/1986 | Milby et al. | 307/150 |
| 4,652,769 | 3/1987 | Smith et al. | 307/31 |
| 4,675,538 | 6/1987 | Epstein | 307/64 |

OTHER PUBLICATIONS

Tracewell Enclosures Catalog, VMI/VXI System Packaging, 567 Enterprise Dr.; Westerville OH 43081, 614/846 6175; Aug. 1989, Catalog-22.
VME Bus Specification Manual, pp. i and 188, Rev. c. 1, Oct. 1985, IEEE P10H/D1.2.
Schroff Catalog, entitled "VXI Systems"; Schroff Inc., Aug. 1989 1/3.25.

Primary Examiner—Jeffrey A. Gaffin
Attorney, Agent, or Firm—Mueller and Smith

[57] ABSTRACT

An enclosure is provided for circuit modules which are mounted as an array in a vertical orientation within a card cage and which are electrically coupled to a back plane positioned rearwardly within the housing. A plurality of specified voltages asserted from a primary power source within the housing are monitored by a microcomputer based control system performing in conjunction with programmable memory. The status of the voltage sources is displayed at a supervisory panel mounted at the front face of the enclosure. This supervisory panel includes an array of light emitting diode based indicators which display both acceptable performance and out of tolerance performance to the operator. The outputs for each channel additionally are associated with a reset switch permitting a form of operator interrogation of any channel in question. The heat transfer air path of the enclosure is initiated along the sides of the enclosure where conveniently accessible elongate and vertically oriented filters are positioned. Air path passes through the card cage in heat transfer relationship with the modules and is monitored at a location downstream from the card cage. An output at the supervisory panel will indicate the presence or absence of proper air flow. The monitoring features of the enclosure are powered from a separate power supply which, in turn, is buttressed by a rechargeable battery back-up performing in conjunction with a d.c.-to-d.c. converter. The batteries of this power supply are conveniently located behind the supervisory panel. An audible alarm also is incorporated at the supervisory panel.

19 Claims, 12 Drawing Sheets

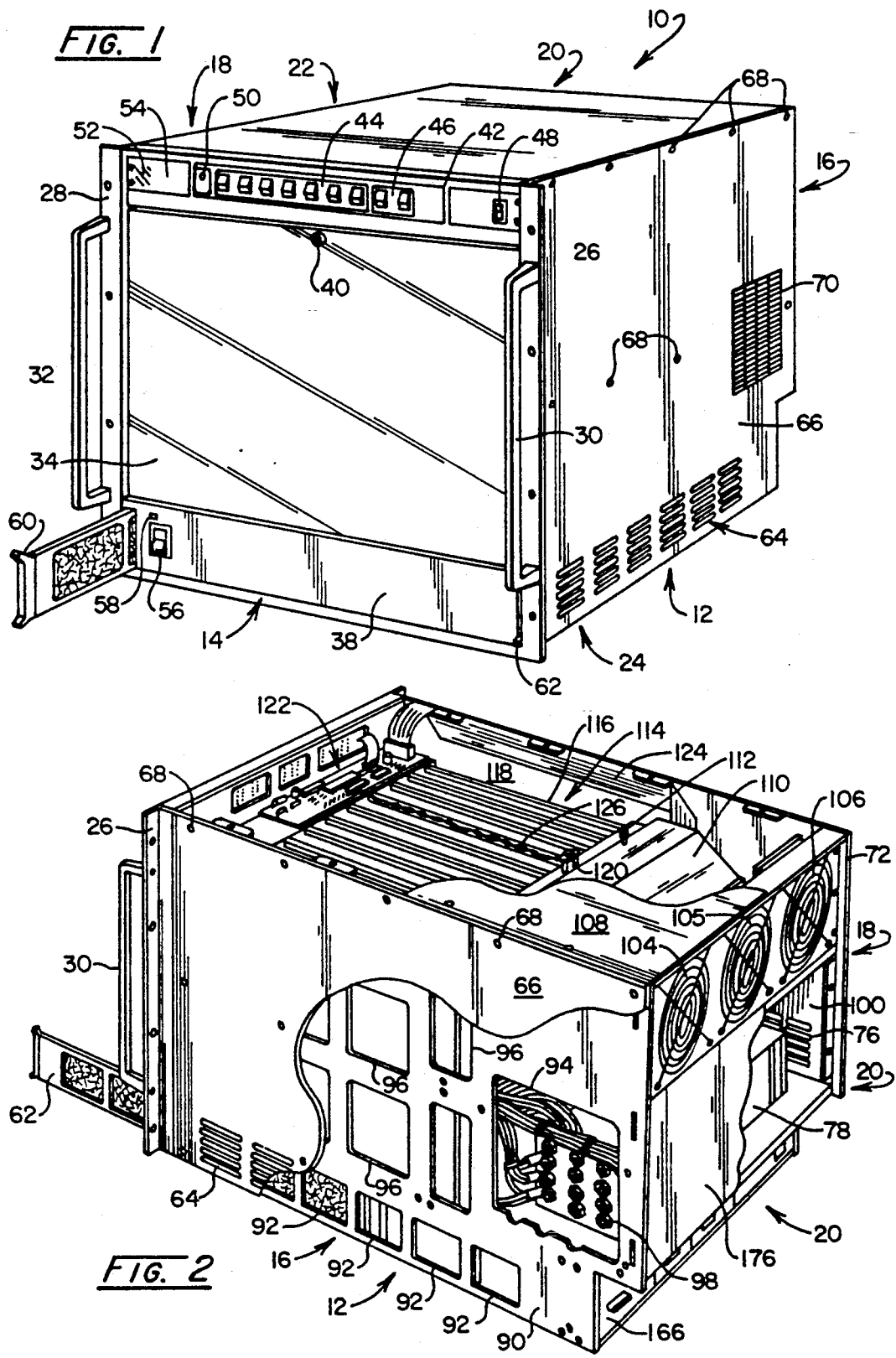

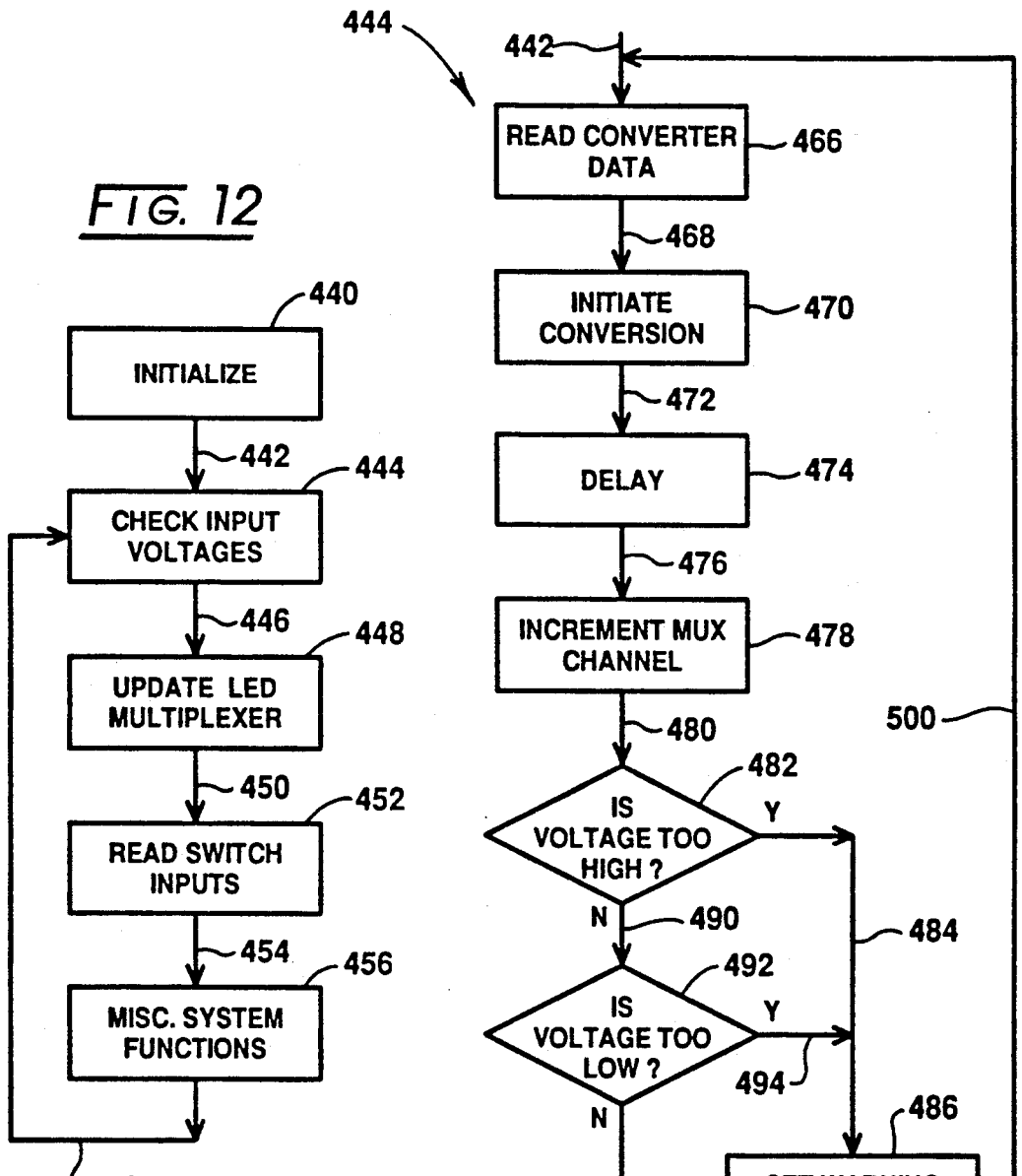

ENCLOSURE FOR CIRCUIT MODULES

BACKGROUND OF THE INVENTION

Electrical instruments traditionally have been assembled within dedicated housings or packages. Such instrument containment devices have been designed, for example, to be rack mounted or to stand alone upon a surface and conventionally have included a dedicated power supply, environmental components such as fans, filters, and the like, functioning to support electronic circuitry. Over the somewhat recent past, both government and industry have recognized the practicality and thus desirability of combining electronic modules having a variety of different, but facility related functions within a singular enclosure. Thus, a centralized support component assemblage including a power source, environmental controls and the like would be combined within a singular enclosure or envelope. These common support components then would service discrete instrument functions which, in turn, would be provided upon more elemental circuit boards which would be, in turn, standardized for insertion and support within the common container. Such circuits are generally referred to now as cards or modules.

The entity established to evolve the specifications for this standardized enclosure is known as the VXI consortium, the term VXI being an acronym for: "VME bus extensions for instrumentation". Within that acronym, the term "VME" represents a back plane/bus structure referred to as "Versa Module Eurocard" developed by Mostek and Signetics Incorporated. Thus, the VXI specification incorporates a standardized back plane referred to as a "VME/VXI" back plane.

Standardization specifications have been developed by the VXI consortium, for instance, a third iteration thereof being promulgated and referred to as the "VXIbus Specification Rev. R1.3." In addition to system environmental requirements concerning air flow and the like, the specification calls for the provision of a sequence of power source derived voltage outputs, each of which, is called upon to remain within defined tolerances. In the latter regard, voltages of $-2$ vdc, $+5$ vdc, $-5.2$ vdc, $+12$ vdc, $-12$ vdc, $+24$ vdc, and $-24$ vdc, are called for within strictly defined tolerances. Additionally, a $+5$ v stand-by source is called for. To the present time, enclosure fabricators have provided the required power sources and air driving components in conjunction with card racks and the like. However, users of the system when combining cards or modules within the enclosures and associated support systems, have been left without a continued assurance that all support systems remain within the VXI mandated performance or output specifications. Considering that several individual cards or modules may be combined within a common VXI specified enclosure and that each may have a value ranging, for example, from $5,000.00 to $20,000.00, it is desirable that any risk of module or card damage or destruction be minimized to the extent possible. For example, should undetected shorts or the like occurring within the wired components evoke a change in voltage from one source to another, for example, from $-2$ vdc to $+24$ vdc, card based circuit destruction may be inevitable. Additionally, should the air filtering systems of the enclosures be blocked or not be maintenanced by cleaning or replacement, or should associated fans driving circulating air malfunction, heat excursions may take place occasioning the damaging or destruction of expensive circuit modules. In general, technical personnel called upon to assemble a card array within a VXI defined enclosure desire an assurance that all support systems are performing within the VXI bus mandated tolerances.

Enclosures heretofore introduced to the market under the aegis of the VXI specification also have posed accessing difficulties to the user. Typically, the procedure for the otherwise simple task of changing filters within air circulation systems has called for rather elaborate disassembly and reassembly activities. User access to components within the enclosures has been difficult, again usually calling for disassembly/assembly routines on the part of servicing personnel. In effect, while the advantages of stringent specifications of environment and power source components has demonstrated the desirability of this common enclosure approach, the assurances of proper performance and practical assessability in the use of the devices heretofore has not been entertained. The enclosures have exhibited a practical "awkwardness" making them unduly cumbersome to use and access in the field.

SUMMARY

The present invention is addressed to an enclosure for electronic circuit modules which provides continuous surveillance of its module support system with attendant supervisory perceptible outputs as to the condition of that system. A resultant reassurance of proper environmental and power source system performance is made available to the user, as well as the provision of necessary warning signals in the event of malfunctioning. Such monitoring features are achieved with a desirable control flexibility which is gained through the utilization of programmable memory in conjunction with microcontroller technology. These system monitoring and readout features are complemented with an enclosure design which permits facile access to internally mounted components. Air filters are side mounted and located away from otherwise interfering cabling. The filters are changed from the front of the enclosure simply and without the need of any assembly/disassembly procedures. With this side mounted filtering geometry, a heat transfer air path is evoked wherein a plenum is developed below the card cage. An elongate baffle which is centrally disposed along the plenum, functions to assure a side distribution of air flow across the entire card cage. This same baffle serves additionally as a protective cableway assuring that front-to-back cabling installed by the user will not interfere with air movement. Monitoring of the air flow occurs at a location selected to evaluate air movement after it has moved through the card cage. Thus monitoring occurs at the most critical location within the air path. This air path is secured even though the noted access openings are provided in the side of the enclosure through the use of side housing supporting plates having access openings therein as well as air intake ports. These side supports are, in turn, closed by readily removable cover panels having appropriate grating therein to maintain the air intake port structuring.

To continuously provide information to the user, a supervisory panel is positioned at the front of the enclosure. This supervisory panel will be seen to support a linear array of light emitting diodes (LEDs). An assemblage of these LEDs is assigned to each voltage source channel as well as the air monitoring and a $+5$ v standby voltage function. Where a monitored channel is within tolerance, a green region LED pair is illuminated and where the channel falls out of tolerance, a red flashing LED is energized in conjunction with a switchable acoustic transducer. Associated with the channel designated LEDs are reset switches which permit the operator to double check a malfunction or out-of-tolerance condition. The supervisory panel also will be seen to support a system fail LED type indicator as well as a system reset switch which is debounced and timed per VME specification. Monitoring control for the enclosure is powered by a supervisory power source which is separate from the primary power source employed with respect to the circuit modules. This stand-by source is monitored at the supervisory panel and is buttressed by a stand-by rechargeable battery pair which is accessible conveniently at the front supervisory panel. Through the employment of a d.c.-to-d.c. converter, stand-by voltages are maintained for emergency shut-down purposes utilizing the stand-by battery power.

As another feature, the invention provides an enclosure of a variety operationally retaining electronic modules requiring power sources of specified voltage levels. The enclosure includes a housing having a front portion, a side, and a rear portion. A back plane is mounted rearwardly within the housing portion, having a sequence of spaced electrical connectors, each configured for receiving an electronic module and has power source input components for selective electrical communication with the electronic modules through the electrical connectors. A first power source is mounted within the housing which has discrete power source outputs corresponding with the specified voltage levels electrically coupled with the power source input components. Further, a supervisory panel is mounted at the housing front portion which has a voltage status indicator responsive to input signals to provide a perceptible output representing the status of voltage levels of the discrete power sources voltages. A control arrangement including a programmable memory for retaining values for the specified voltage levels and tolerances associated therewith, is responsive to the discrete power outputs and to corresponding memory retained values-in leiu thereof, for deriving an input signal representing an acceptable voltage state when a discrete power source exhibits a voltage value corresponding with the specified voltage level and it derives an input signal representing an unacceptable voltage state when the discrete power source output exhibits a voltage of value not corresponding with the specified voltage level.

Another feature of the invention provides an enclosure of a variety operationally retaining generally planar electronic modules. The enclosure includes a housing having front, side, and rear portions. A back plane is mounted rearwardly within the housing, having a plurality of spaced electrical connectors, each configured for receiving an electronic module in a generally vertical orientation. An air intake is formed within the housing and at least one fan is mounted within the housing and is energizable to draw air along a path extending from the air intake in thermal exchange across the surface of the electronic modules. An air flow sensor is mounted in the housing within the path at a location intercepting air subsequent to its passing across the electronic modules and which has a first output condition in the absence of an acceptable air flow thereacross. An air flow status indicator is mounted at the housing front portion which is responsive to input signals to provide a perceptible output representing the output condition of the air flow sensor. A control arrangement responds to the air flow sensor first output condition for deriving an input signal to provide the perceptible output representing the absence of an acceptable air flow.

As another feature, the invention provides an enclosure of a variety operationally retaining electronic modules requiring power sources of specified voltage levels. A generally rectangular housing is provided having a hand-accessible front portion, spaced apart side portions and a rear portion which define the periphery of an enclosure. A back plane is mounted rearwardly within the enclosure having a sequence of spaced electrical connectors, each configured for receiving an electronic module. A power supply is mounted within the housing having discrete power source outputs corresponding with the specified voltage levels and connectable with the modules through the back plane. A card cage is positioned with the housing having first and second spaced parallel arrays of support members for vertically supporting the modules in adjacency with the back plane. An air flow plenum region is developed within the enclosure which is located adjacent the first array of support members and an air flow receptor region is located within the enclosure adjacent the second array of support members. An intake port arrangement comprising two regions of openings, one region of openings being disposed within each of the spaced apart housing side portions and substantially coextensive with the air flow plenum region is provided; for receiving air as the commencement of an air path directed to the air flow plenum, thence, in turn, through the card cage and the air flow receiving region. An air filter arrangement comprising two elongate air filters, each vertically oriented and slideably mounted adjacent one of the two regions of openings is provided, each being positioned over the intake port within the housing and this air filter arrangement is hand accessible for replacement from the front portion, the air filter serving to remove contaminates from air entering the air path. A fan arrangement is mounted upon the housing for drawing air through the input port arrangement, thence along the air path and outwardly from the housing enclosure.

Other objects of the invention will, in part, be obvious and will, in part, appear hereinafter.

The invention, accordingly, comprises the apparatus possessing the construction, combination of elements, and arrangement of parts which are exemplified in the following detailed disclosure.

For a fuller understanding of the nature and objects of the invention, reference should be had to the following detailed description taken in conjunction with the accompanying drawings.

BRIEF DESCRIPTION OF THE DRAWINGS

FIG. 1 is a perspective view of an enclosure according to the invention with one air filter pulled partially forwardly from its normal position;

FIG. 2 is another perspective view of the enclosure of FIG. 1 looking from a rear corner position and with portions broken away to reveal internal structure, and another side air filter pulled slightly forward;

FIG. 12 is a flow chart showing an overall control program for the enclosure of FIG. 1;

FIG. 13 is a flow chart showing a voltage checking routine employed with the process of FIG. 12;

DETAILED DESCRIPTION OF THE INVENTION

Figure 3:
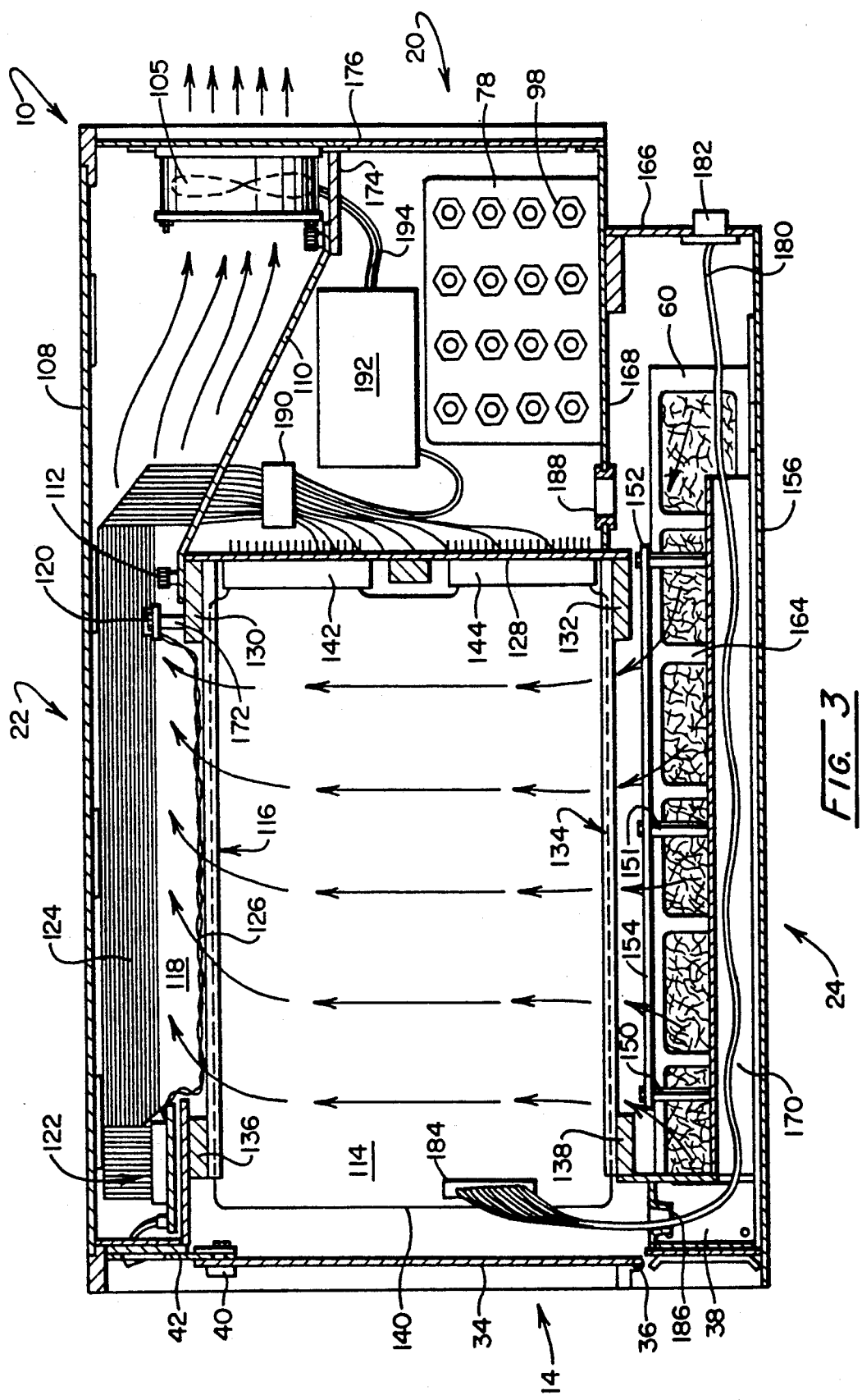
FIG. 3 is a partial sectional view of the enclosure of FIG. 1 with a main power supply shown in non-sectional form.

Referring to FIG. 1, an enclosure configured in accordance with the teachings of the invention is revealed in perspective fashion in general at 10. Enclosure 10 is formed to include a housing represented generally at 12 which includes a front portion 14, oppositely disposed side portions 16 and 18, rear portion 20, top portion 22, and bottom portion 24. Forward portion 14 of the device 10 is seen to include conventional mounting flanges 26 and 28 with respective handles 30 and 32 which are positioned on either side of a transparent planar forward door 34. As seen in FIG. 3, the door 34 is mounted to the enclosure 10 by a hinge 36 extending across the housing 12 just above a lower forward panel 38. Door 34 is retained in its closed upright orientation by a key actuated latch 40.

Above the door 34, extending across the housing forward portion 14 upper region is an upper, supervisory panel 42 which is seen to support a linear sequence of perceptible indicators which will apprise the user of the instantaneous status of each of the specification defined voltage levels, as well as air flow. The indicators are provided, for example, as light emitting diodes (LED) which have an output in the green region of the spectrum where a given channel supply voltage at the back plane is within specification and a red flashing LED derived output where that particular channel voltage is without specification tolerances. Associated with each such LED derived perceptible output is a hand actuated reset switch for each such channel. These switch and LED functions for specified +5 v, +12 v, −12 v, −5.2 v, −2 v, +24 v, and −24 v are arranged within the panel switch and indicator grouping 44 respectively from left to right. Positioned adjacent grouping 44 is a two switch and LED derived perceptible indicators grouping 46 which provides the same form of output indication in conjunction with a reset switch for a +5 v stand-by source and the presence or absence of appropriate air flow within the system. A System Reset switch is positioned at 48. Switch 48 functions to provide a specified reset condition at the back plane within enclosure 10. To the left of panel grouping 44 is a System Fail output indicator provided as an LED 50. The latter indicator is a specified failure condition which is detected from the back plane within enclosure 10. Leftwardly of System Fail indicator 50 is an audible annunciator (not shown) positioned behind a slot form of grill 52 and a slide switch 54 which may be operator actuated to mute the audible output from the annunciator at grill 52. That audible annunciator will provide a tone output on the occasion of system fail, the falling out of specification of any of the panels monitored at panel 44 or failure detection indicated at grouping 46.

Within lower forward panel 38 there is positioned a general power on and off switch 56 and an associated power indicator light 58.

Figure 4:
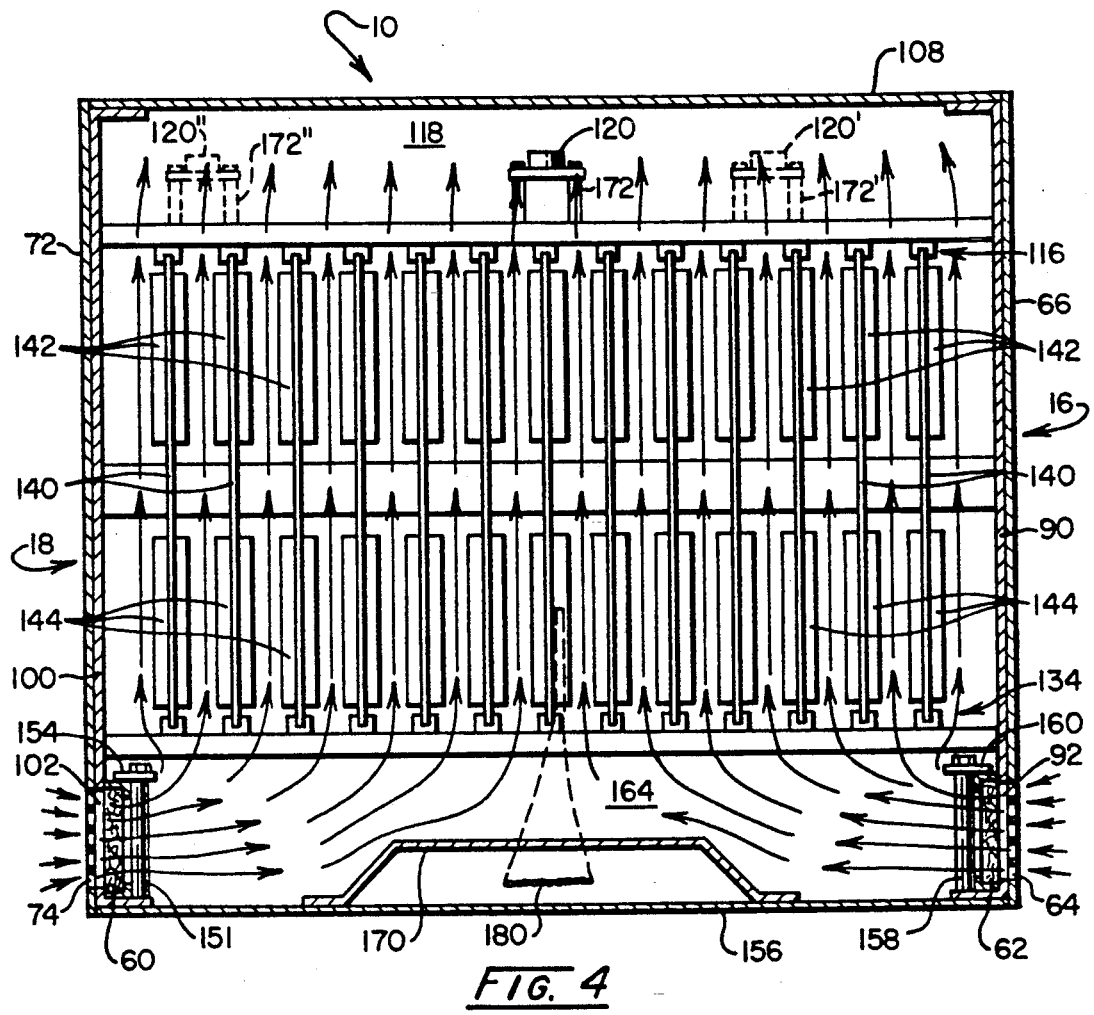
FIG. 4 is a side sectional view of the closure of FIG. 1 taken transversely with respect to the section shown in FIG. 3.

At each side of the lower forward panel 38, access is provided for the insertion and removal of two, vertically oriented elongate air filters 60 and 62. In FIG. 1, filter 60 is shown partially withdrawn from its elongate receptacle and, additionally, the figure shows the horizontally disposed array of air intake port slots 64 adjacent filter 62 which are formed in an outer removable cover panel 66 attached to the enclosure housing by flat head machine screws, certain of which are identified at 68. Cover 66 also includes an air exhaust grill 70 which is utilized in conjunction with the primary or principal power supply for the back plane of enclosure 10. A similar removable outer cover panel 72 is removably attached by flat head machine screws to side portion 18 and, as seen in FIG. 4, includes an air intake port grill 74 positioned before the elongate filter 60 and, as seen in FIG. 2, an air intake port 76 for air input to the primary power supply generating the noted specified voltages and pictured at 78.

FIG. 2 reveals an important feature of the housing 12 of enclosure 10. In this regard, note that the side portion 16 is formed having a side member or plate 90 within which an elongate region of openings 92 have been formed as part of the air intake port associated with filter 62. However, additionally, access openings are positioned within the member 90, first as shown at 94 to provide user access to the connection or multiple outputs of the power supply 78. Next, an array of rectangular openings as at 96 is positioned within member 90 along side portion 16 to permit user access to the modules or cards retained by enclosure 10. For example, the nut type connectors for power supply 78 as at 98 may be accessed through opening 94 with a conventional torque wrench to provide connection for power supply communication with the back plane. Enclosure 10 then is made secure by the positioning of the outer removable panel 66 over side plate 90, machine screws as at 68 maintaining it in place. A similar side member or plate 100 is located at side portion 18 as seen in FIG. 4. Member 100 includes an elongate region with sequence of rectangularly shaped intake ports associated with filter 60, one of which is seen at 102 in that figure. As in the case with side portion 16, panel 72 is removably attached by machine screws to side member 100.

Returning to FIG. 2, the power source or supply 78, as marketed under the designation "Stak PAC" by WESTCOR, and is a high reliability, 500,000 hour MTBF, multi-output type that provides all seven of the specified VXI bus voltages. Power supply 78 has builtin thermal protection and includes a self-contained air circulation fan which functions in conjunction with the intake port 76 and exhausts through opening 94 and grill 70 (FIG. 1). That air flow path is isolated from and transverse to the air flow path established with the intake ports associated with filters 60 and 62, as well as with a bank of three fans 104-106 mounted at the rear portion 20 of enclosure 10. Fans 104-106 preferably are powered by d.c. motors which, in turn, are controlled from the standpoint of speed by thermally responsive elements associated with each fan. For example, the fans may operate at slow speeds for cooler air temperature and, to increase thermal exachange between the electronic components within enclosure 10 and the air stream, operate at more rapid rotational speeds as temperatures increase. Generally, the transition from one speed to the other occurs over a hysteresis defining band, for example from 37° C. to 40° C. Fans 104-106 may be provided, for example, as a device marketed under the trade designation "Smartfan" by Minebea Company Ltd. of Japan. The air path extending to fans 104-106 is defined, in part, by top cover 108 of top portion 22 as well as a duct plate 110. Plate 110 is removably mounted within the housing 12 through the utilization of hex cap screws, one of which is revealed in FIG. 2 at 112 connected with the top of the card cage assembly of enclosure 10 represented generally at 114. At the uppermost portion of the card cage assembly 114 is an array of parallel support members or card guides 116 which extend forwardly towards the front portion 14. Above the card guide array 116 there is defined with the top panel 108 a receptor region 118 forming part of the air flow path through enclosure 10. That air flow will be seen to be monitored by an air flow sensor 120 positioned adjacent the duct plate 110.

Forwardly of the card cage assembly 114 and behind the upper front panel switching and status indicator grouping is a supporting circuitry represented genrally at 122. Communication between the circuitry 122 and certain of the rearwardly disposed components, including a dedicated power supply is a ribbon bus 124 which is adhesively coupled to the inside of housing side member 100. Additional electrical communication is provided by a lead grouping 126 shown at the top of assembly 114 extending from the circuitry 122 rearwardly for connection with air flow sensor 120.

Turning now to the sectional view of enclosure 10 represented in FIG. 3, card cage assembly 114 is revealed in sectional fashion as being positioned perpendicularly and adjacent to the back plane 128. Back plane 128 is seen coupled to upper and lower horizontally disposed cross bars shown, respectively, at 130 and 132. Cross bar 130, additionally, supports one end of the array of card guides or supports 116, while cross bar 132 supports a similar lower disposed array of support members represented generally at 134. The forwardly disposed ends of arrays 116 and 134 are seen supported, respectively, by cross bars 136 and 138.

Card cage assembly 114 supports an array of circuit modules, each of which is represented in simplified form at 140 in the drawing. Looking additionally to FIG. 4, it may be observed that 13 such modules are shown installed in a parallel vertically oriented array, the rearward end of each being slideably received within connectors as at 142 and 144 forming part of the back plane 128.

FIGS. 3 and 4 reveal the air path developed upon the energization of fans 104-106. Air enters the enclosure 10 along its lower sides at intake ports located in adjacency with the elongate air filters 60 and 62. Note in FIG. 3 that filter 60 is slideably retained in place by a sequence of three stanchions 150-152 which support an overhead retainer bar 154. Retainer bar 154 serves as an overhead retainer along the upper length of the filter 60. The lower surface of the filter 60 is seen to slideably rest upon a flange formed in side member 100 which, in turn, is connected to a floor plate 156. Filter 62 is retained in place in the same manner, FIG. 4 revealing a stanchion 158 of the three utilized along with a retainer bar 160.

Air passing through the filters 60 and 62 is drawn into a plenum region represented generally at 164 which is defined by lower forward panel 38, floor plate 156, and, as seen in FIG. 3, a lower back panel 166 and power supply floor 168.

Arrows positioned in FIG. 4 show that the air enters from the sides of enclosure 10 and is drawn into the plenum region 164. At the center of the plenum region 164 there is positioned a cable way 170, the sides of which slope toward side portions 16 and 18 and carry out a baffling of entering air assuring its distribution upwardly through the card cage 114 side regions. FIG. 3 contains arrows depicting the upwardly directed movement of air along the circuit modules 140. As the air moves across these modules in thermal exchange, it is retained by the back plane 128 and forward door 34. It then enters the receptor region 118 which is defined by the top cover 108 along with side panels 66 and 72 (FIG. 4). As the air moves rearwardly, it passes over and is detected by the solid state air flow switch 120, which is seen to be mounted upon a stand-off 172. As seen in FIG. 4, additional air switches can be installed across the enclosure 10. In this regard, an additional air sensor is shown in phantom at 120' mounted upon a stand-off 172' and at an opposite side of the enclosure 10 at 120" in conjunction with stand-off 172". Devices as at 120 may be provided, for example, as a solid-state air flow switch marketed by Warren G-V, a unit of General Signal Corporation of Whippany, N.J. Such devices are described, for example, in U.S. Pat. No. 4,686,450. Other air flow sensors may be employed. For example, a hinged wing responsive to air flow may be employed to selectively occlude light transmission between a light emitting diode and a solid-state photoresponsive device.

FIG. 3 shows that upon passing the detector or switch 120, the air flow then is directed by duct plate 110 to the fans 104-106. The figure shows that duct plate 112 is removably retained by machine screws 112 at cross bar 130 and a flange component 174. With the geometry shown, the air flow and air path resulting from the operation of fans 104-106 is separate from that generated transversely across enclosure 10 by power supply assemblage 78. The latter transverse air path is seen to be contained within a duct including plate 110, back plane 128, and upper rear panel 176.

FIGS. 3 and 4 further reveal that the cableway 170 functions to retain cabling extending from the rearward portion of the enclosure 10 to the forwardly disposed portion. For example, a ribbon bus as seen at 180 in FIG. 3 may extend from a connector as depicted at 182 within lower panel 166 to a forward connection as at 184 with a circuit module 140. The cableway 170 assures that such cabling will not be drawn upwardly by the air stream to block air access through the labyrinth of modules within card cage 114. In typically encountered enclosures, air filtering for the air path is by a horizontally oriented filter located at the bottom of the enclosure. Because of the rearward to forward cabling associated with the modules within the enclosure, changing the filters has heretofore required a substantial disconnect and reconnect effort. The advantages accruing with the utilization of side mounted filters which are accessible from the front of enclosure 10 thus becomes apparent. Filters can be changed or removed and cleaned and replaced without a requirement for disconnecting and reconnecting cabling.

FIG. 3 further reveals that the enclosure 10 includes cable protecting grommets. In this regard, a continuous plastic grommet 186 extends across front portion 14 immediately behind the lower front panel 38. Additionally, cabling access is made available to the user by spaced grommets having circular openings therein positioned within the power supply floor 168, one such grommet being represented at 188. Ribbon cable 124 is seen in FIG. 3 to extend to a connector 190 from which, in turn, certain leads extend for connection to a d.c. power supply 192. Connection also is made by discrete leads extending for monitoring pruposes and the like to the back plane 128. The d.c. power supply 192 is seen coupled in driving relationship with the fans 104–106 as represented by cabling 194.

Figure 5:
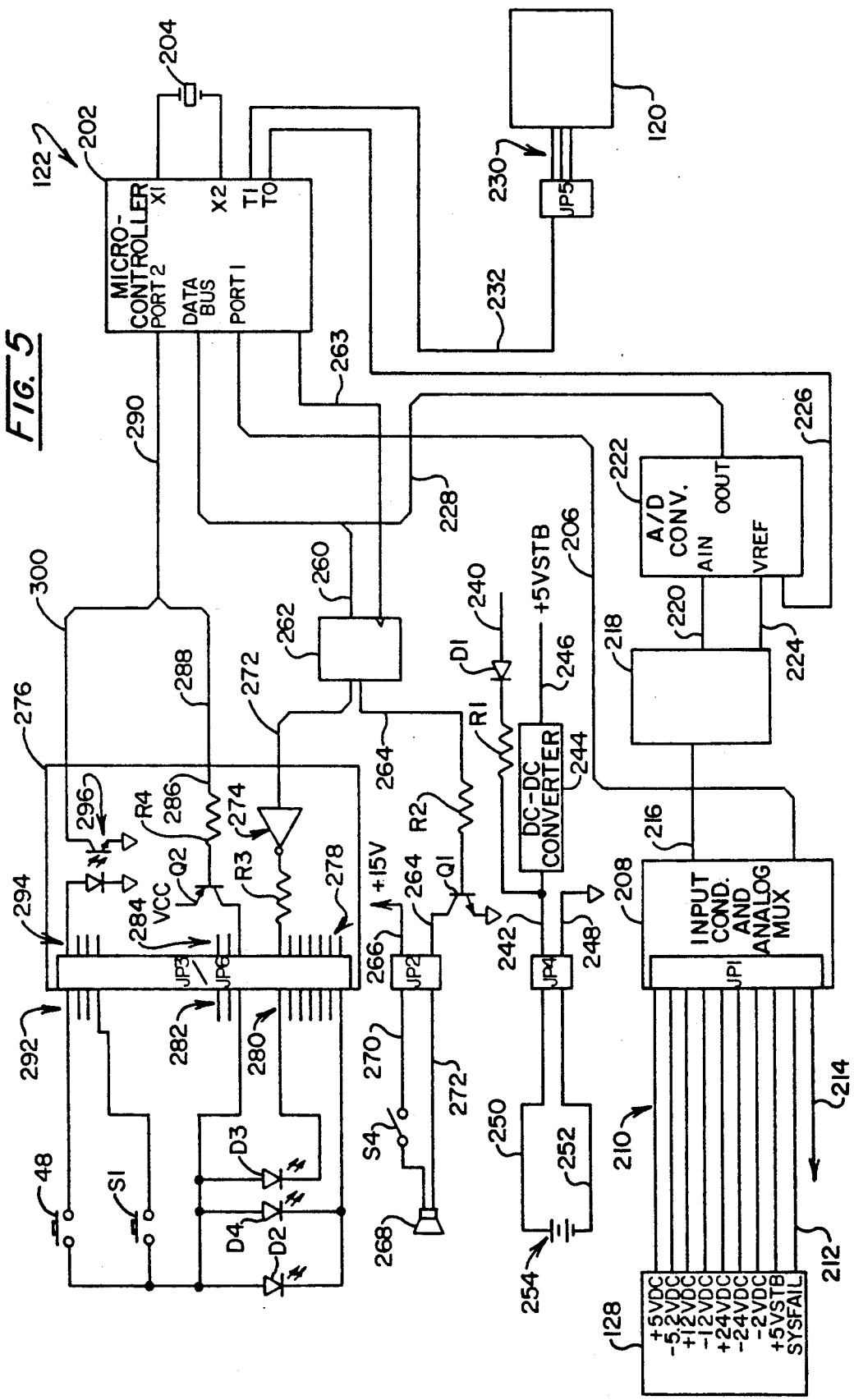
FIG. 5 is a schematic representation of the circuit employed with the enclosure of FIG. 1.

Referring to FIG. 5, a generalized block schematic diagram of the electronic monitoring, control and readout features is revealed. This circuit is that referred to generally at 122 in FIGS. 2 and 3, and again is generally identified by that numeration. A highly desirable feature of the enclosure 10 is the facility for custom programming it to meet the specific needs for supporting a given array of circuit modules 140. This programming flexibility is made available through the utilization of a microcontroller represented at 202. Microcontroller 202 may be provided, for example, as a single component 8-bit microcomputer type 8748 marketed by Intel Corp. Such microcomputers are self-sufficient, 8-bit parallel computers containing a 1K×8 user programmable and erasable EPROM program memory, a 64×8 RAM data memory and 27 I/O lines. Device 202 performs in conjunction with a 6 MHz crystal base clock oscillator 204 and functions to carry out the evaluation of specification based voltages at back plane 128; respond to system fail signals emanating from the back plane; respond to switching inputs at the front panel 42; develop the perceptible outputs at panel 42 including the energization of light emitting diodes (LEDs) and an audible tone. Communication of the microcontroller 202 with back plane 128 is carried out through a variety of channels including a multiplex polling of the specification based voltage sources. For this purpose, a four line multiplex address bus 206 is seen directed to an input conditioning and analog multiplexing function represented at block 208. Block 208, additionally, is seen to be associated with a header or connector identified as JP1. Leading to this header are monitored analog values for the seven specification mandated voltages as well as a +5 v standby voltage. The line array representing these voltages is represented generally at 210 extending to block 128. Array 210 corresponds with ribbon bus 124 described in conjunction with FIG. 3. Additionally extending from block 128 or the back plane is the specified system fail (SYSFAIL) signal at line 212 and, correspondingly, extending from the header JP1 to the back plane 128 is a system reset signal (SYSRESET) as at line 214. In general, the system reset signal is derived in conjunction with the pushing of switch 48 which, in turn, will derive a response from the microcomputer 202 developing a 200 millisecond pulse in accordance with specifications. The multiplex selected eight voltage values are directed by the multiplexing function at block 208 via line 216 to a signal conditioning or amplification stage represented at block 218. At this stage, the voltages are scaled to a 0 to 5 volt range suitable for carrying out their conversion to digital form. In this regard, the thus-treated signals are directed via line 220 to the analog input of an analog-to-digital converter represented in general at block 222. The offset voltage to amplifier stage 218 is directed from the voltage reference port of converter 222 as represented at line 224. A clock input to the converter 222 is provided from microcontroller 202 as represented at line 226 and the 8-bit output thereof is directed via bus 228 to the data bus inputs to microcontroller 202.

Additionally monitored by microntroller 202 is the earlier-described air flow sensor 120 now identified as a block with the same numeration. The three line output from sensor 120 is seen directed to a connector or header identified as JP5 and the output therefrom is directed via line 232 to the T0 input of microcontroller 202.

Figure 6:
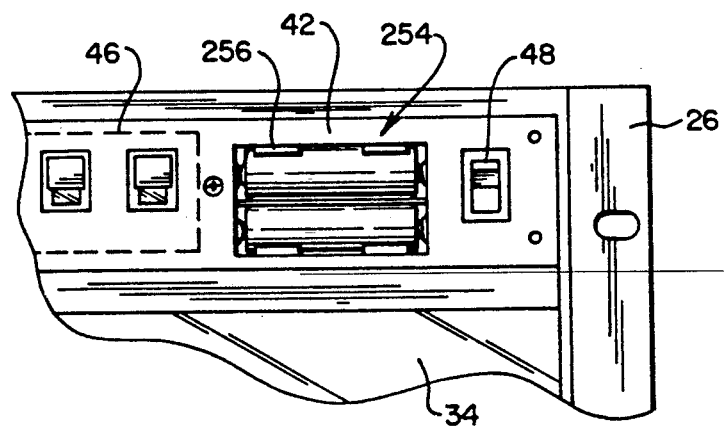
FIG. 6 is a partial front view of the enclosure of FIG. 1 with a front panel component removed to reveal a battery mounting.

One of the advantageous features of the enclosure of the invention resides in the utilization of a separate power supply for system controls as described earlier at 192 in FIG. 3. This supply is that which is utilized by the instant circuit which monitors the principal specified power supplies, air flow, and the like and, thus, an avoidance of utilizing a primary power supply as the power source for its own monitor is avoided. This power supply input is seen directed via line 240 including diode D1 and resistor R1 to line 242. Line 242, in turn, is coupled to the input of a d.c. to d.c. converter represented at block 244. Converter 244 develops the noted +5 v stand-by source as represented at line 246. Line 242 also is directed to a connector or header identified at block JP4, one coupling of which is directed via line 248 to ground and two connections of which at lines 250 and 252 are directed to the terminals of two AA size rechargeable nickel cadmium batteries represented at 254. Thus, in the event of system power failure, the batteries 254 will provide back-up power to permit orderly shut down of the systems represented by the modules retained within the enclosure 10. Through the utilization of the d.c. to d.c. converter 244, the +5 v stand-by voltage can be maintained even though the batteries are drawn down significantly, for example in the range of about 1.9 volts. Recharging of the batteries when not called upon to supply power is effected through diode D1 and resistor R1. The enclosure 10 also provides a convenience of access to the two serially connected batteries 254. Looking momentarily to FIG. 6, it may be seen that the batteries 254 are readily accessible to the user by virtue of their being mounted in a spring clip retainer 256 which is mounted at the front panel 42 of the enclosure. Thus, the inspection and changing of batteries 254 is simply carried out by the user.

Now considering the perceptible output and switch actuated reset functions at the front panel 42, it may be observed that bus 228 branches at 260, whereupon it is directed to a latch function represented at block 262. One output of the latch function 262 is seen at line 264 being directed through a base resistor R2 to the base of an NPN transistor Q1. The emitter of transistor Q1 is seen coupled to ground, while the collector thereof is directed through a connector or header identified at block JP2 via a line 264. Header JP2 also receives +15 v supply via line 266 and is coupled to an alarm transducer, for example of the piezoelectric type via lines 270 and 272. Line 270 is seen to contain mute switch 54 which is the slide switch at panel 42 described in conjunction with FIG. 1. Transducer 268 is positioned behind grill 52 at panel 42 as illustrated in connection with FIG. 1.

Microcontroller 202 also supplies a logic word via bus 260 to latch 262 in conjunction with a clock input at line 263. Latch 262, in turn, carries out one aspect of an LED selection function by the provision of a resulting output signal at seven lead bus 272. The leads of bus 272 are each directed to a sink driver function represented generally at 274 and located within block 276 containing components representing a typical interface to the front panel 42. Thus, an array of seven such drivers as seen at 274 is provided, each with a current limiting resistor as represented at R3 for connection with a header or connector JP3. This seven lead array is represented generally at 278 and reappears as seven lead array 280 on the opposite side of header JP3. Each of the leads of the seven lead array in general, one lead from the seven lead array 280 is coupled with three sets of paired light emitting diodes emitting in the green region, one such pair being shown at D2 and D4. Additionally, a lead in the array 280 is directed to the cathode of a set of three LEDs, one of which is seen at D3 which emit within the red region of the visible spectrum. Two LEDs as at D2 and D4 are employed with each of the outputs within panel regions 44 and 46 as described in conjunction with FIG. 1. One red LED such as that shown at D3 is joined with the paired green emitting LEDs. Additionally connected to the array of LEDs are three voltage sources developed at three line arrays 282 and 284, also seen associated with header or connector JP3. One typical voltage source is shown within block 276 for coupling with a lead of the array 284. In this regard, a PNP sourcing transistor Q2 is shown having its emitter coupled with VCC source and its collector coupled with one lead of the array 284. The base of the transistor is coupled through resistor R4 with one lead 286 of a three lead bus 288. Bus 288 extends, in turn, as a branch of bus 290 which is coupled to port 2 of microcontroller 202. With the arrangement shown, a low true output at driver 274 provides for the illumination of a select green region emitting LED pair or a red region emitting LED under a matrix logic including line arrays 284 and 278.

The three PNP transistor based sources such as that at Q2 serve an additional function of providing a source for the system and alarm reset switches at forward panel 42. This includes the switches within panel regions 44 and 46 as well as system reset switch 48. To monitor the presence or absence of an actuation of the switches, one third of them are coupled with the sourcing transistors as at Q2 and they are connected by four lines as represented by arrays 292 and 294 at header or connector JP3 with a corresponding four opto-isolators, one of which is shown at 296. The outputs of the four opto-isolators are coupled to the leads of a four line bus 300 which extends to port 2 of microcontroller 202 from bus 290. Thus, a matrix logic may be evolved for monitoring the actuation of the switches. In general, software associated with microcontroller 202 will carry out a debouncing of the alarm reset switches as at S1 and will provide a form of software filtering of the system reset switch 48.

Figure 7:
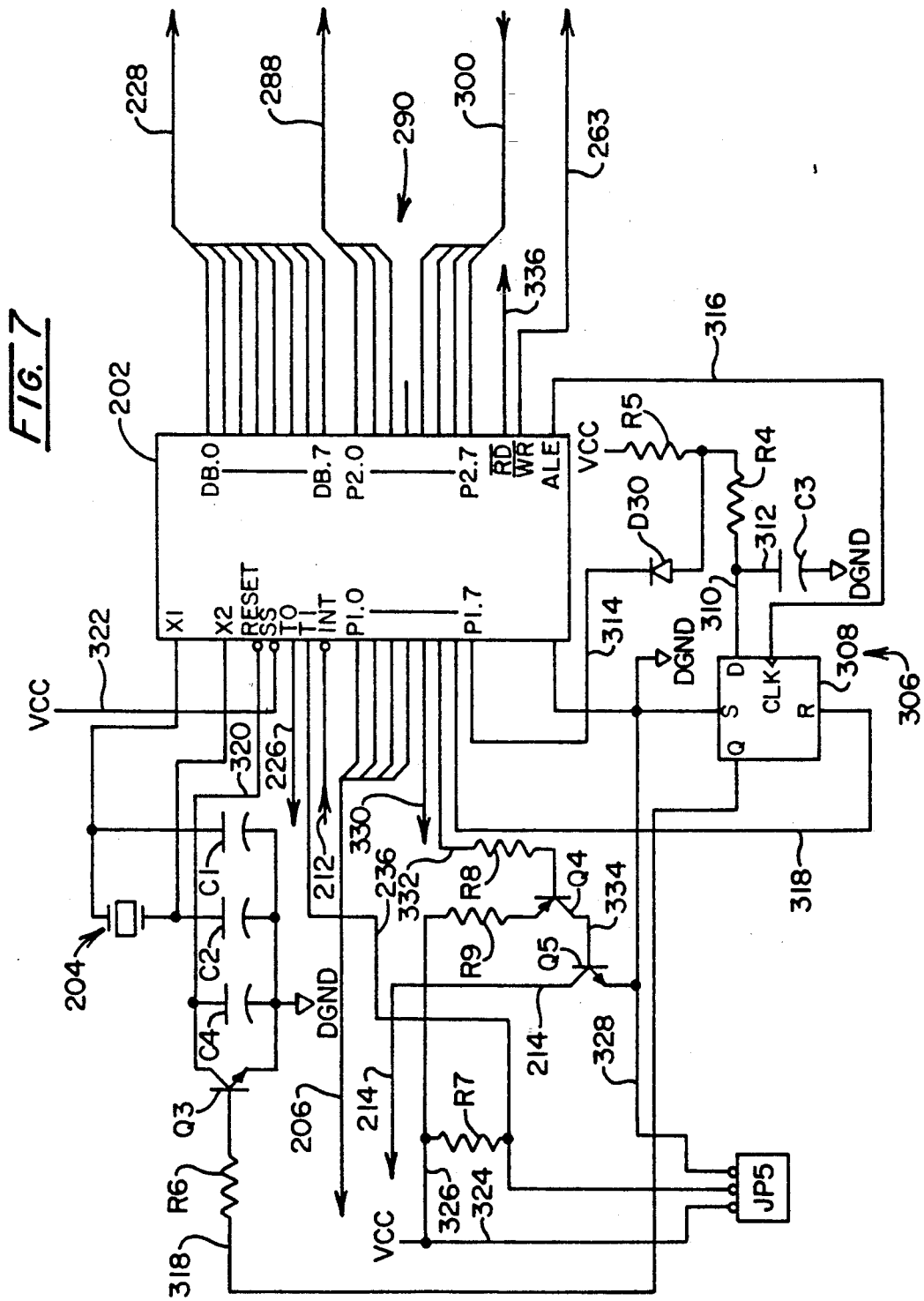
FIG. 7 is a circuit drawing of the central processing unit of the circuit of FIG. 5.

Referring to FIG. 7, a more detailed representation of the microcontroller 202 and its associated connection is revealed. The X1 and X2 terminals of device 202 are seen coupled to crystal oscillator 204. Additionally, the leads from that oscillator are seen to be coupled with stabilizing capacitors C1 and C2.

Device 202 performs in conjunction with a watchdog timing function represented generally at 306 and which is seen to include a type 4013 flip-flop 308, the D input ot which is coupled via line 310 incorporating discharge resistor R4 and charging or timing resistor R5 to VCC. A timing capacitor C3 is coupled between ground and line 310 by line 320. Timing capacitor C3 is slowly charged through resistor R5 and will be discharged with each control cycle through resistor R4 and diode D30 within line 314 extending to port P1.7 of device 202. The clock input to flip-flop 308 is coupled with the ALE terminal of device 202 via line 316, while the reset terminal thereof is coupled via line 318 to the P1.6 port. In the event there is no discharge of capacitor C3, a logic high signal will develop at the Q terminal of device 308 for presentation along line 318 and resistor R6 to the base of NPN transistor Q3. The collector of transistor Q3 is coupled to the reset terminal of microcontroller 202 via line 320. Thus, when turned on by the watchdog function 306, the device 202 is reset. A power on reset function also is provided at line 320 by a capacitor C4.

VCC source is coupled to the SS terminal of device 202 via line 322, while the clock output to analog-to-digital converter 222 is provided by line 226 at the T0 terminal. The T1 terminal monitors the state of air flow through enclosure 10 as developed from sensor 120 at line 236. In the figure, header or connector JP5 is reproduced, the three inputs thereto including line 324 carrying VCC which, additionally, is coupled to line 236, which extends to a pull-up resistor R7 which, in turn, is coupled to line 236 and header JP5. Resistor R7 is a for the open collector output of air flow sensor 120. The third input to header JP5 is ground at line 328. The next terminal in line at device 202 is the interrupt input which is coupled directly to receive the system fail (SYSFAIL) signal from the back plane 128 via line 212. Ports P1.0 through P1.3 provide the earlier-described four line multiplexing address bus 206 which is directed to the analog multiplexing function described in conjunction with block 208 in FIG. 5. Next, the high byte enable (HBEN) input to analog-to-digital converter function is provided at port P1.4 and line 330.

The system reset (SYSRESET) to back plane 128 is developed from port P1.5. When the reset switch 48 is depressed, its action will be debounced in software and port P1.5 will be driven low for 200 milliseconds. This port is coupled via line 332 and base resistor R8 to the base of PNP transistor Q4. The emitter of transistor Q4 is coupled with line 326 containing resistor R9 and its emitter is coupled in paired fashion via line 334 with NPN transistor Q5, the emitter of which is coupled to ground through line 328 and the collector of which is coupled to the system reset (SYSRESET) line 214 which is directed to back plane 128.

On the opposite side of device 202 the data bus ports DB.0-DB.7 are shown coupled to bi-directional databus 228. Additionally, branch bus 288 is seen coupled to ports P2.0-P2.2 and branch bus 300 is shown coupled to ports P2.4-P2.7. The $\overline{\text{READ}}$ output of device 202 seen coupled to a line 336 which will be seen to be, in turn, connected to the chip select and read terminals of the A/D converter 222. Similarly, the $\overline{\text{WRITE}}$ terminal of the device is coupled via line 263 to the clock input of latch 262.

Figure 8:
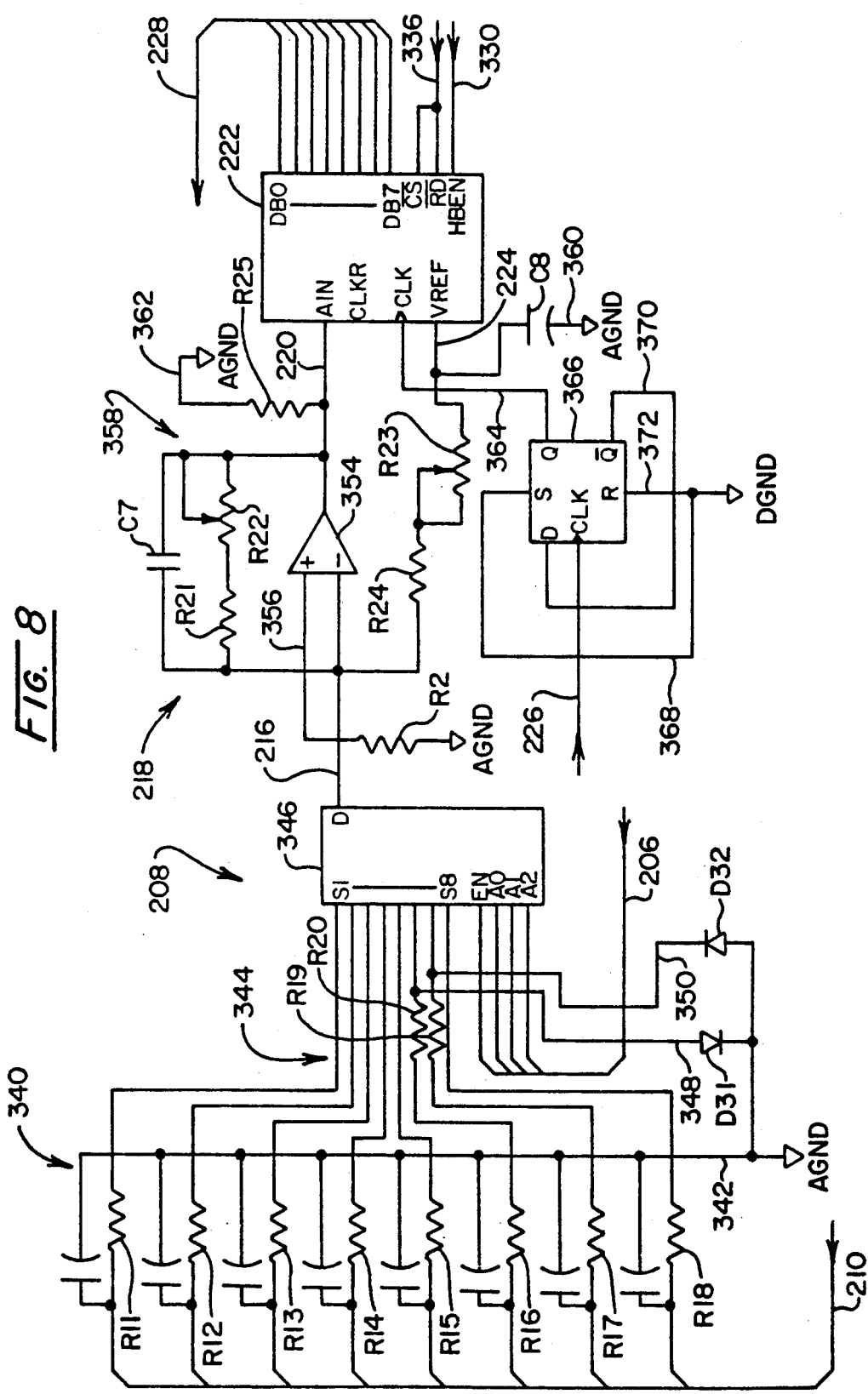
FIG. 8 is a circuit drawing of the analog input features of the circuit of FIG. 5.

Referring to FIG. 8, the analog treatment and digitization stages described in general at 208, 218, and 222 are revealed at an enhanced level of detail. The analog in bus 210 (AIN0-7) again is reproduced as delivering the seven specification based voltages as well as 5v standby from the back plane 128. Bus 210 has been illustrated at least in part as bus 124, for example in FIG. 3. The leads of bus 210 are thus seen branching to form a line array to which filter capacitors C6-C13 are coupled and, in turn, connected via line 342 to analog ground. Also within the line array 340 are divider resistors R11-R18. The lines emanating from array 340, then are seen to be compiled at array 344 for introduction into the S1-S8 analog input ports of analog-to-digital converter 346. Converter 346 may be provided, for example, as a type DG508ACJ marketed by Harris Semiconductor. Within the array 344 and with respect to the two leads thereof emanating from the +24v and −24v monitored inputs, are two additional divider resistors R19 and R20 as well as two tap lines extending therefrom respectively at 348 and 350. Lines 348 and 350, in turn, incorporate oppositely oriented diodes D31 and D32. Resistors R19 and R20, in effect, reduce the 24 v input to a 12 v level suited for converter 346. The lines then extend to analog ground. At such time as the multiplexer 346 is in an off condition, it is desirable to assure that the 24 v level inputs feeding it do not reach levels which exceed the voltage limitations of the device. Diodes D31 and D32 function to sink any excessive charge condition. Selection of the lines S1-S8 of multiplexer 346 is from four line bus 206 extending to the enable and A0-A2 terminals thereof from microcontroller 202. The D or select analog output of device 346 again is represented as being present at line 216 and is directed to an amplification stage earlier generally depicted at 218 and shown in general with that same numeration in the instant figure. Line 216 is seen being directed to the inverting input of an operational amplifier 354, the output of which is provided line 220. The non-inverting input to amplifier 354 is coupled through a line 356 incorporating resistor R20 to analog ground. The gain of amplifier 354 is controlled by potentiometer R22 and resistor R21 within a feedback path represented generally at 358. Also across these resistors is a filter capacitor C7. The offset of stage 218 is derived from the VREF terminal of analog-to-digital converter 222 at line 224 which is seen being directed through potentiometer R23 and resistor R24 for connection with line 216. Line 224 is seen to be filtered by capacitor C8 within a line 360 coupled to analog ground and output line 220 is seen coupled with resistor R25 within line 326 to analog ground. With the arrangement shown, the stage 218 functions to maintain the signal introduction to converter 222 to within the 3 to 5 volt range.

The clock input to converter 222 is applied from line 364 which, in turn, is derived from the Q output of a D flip-flop 366. Device 366 may be, for example, a type 4013 and the clock input thereto is derived from microcontroller 202 at earlier-described line 226. The set terminal of device 366 is coupled to digital ground via line 368, while the $\overline{Q}$ output thereof is coupled via line 370 to the D input thereof. Finally, the reset input is coupled via line 372 to digital ground. Thus, the 2 MHz clock output from microcontroller 202 is divided in half to a 1 MHz output at line 364 which is suited for employment by converter 222. The chip select and read terminals provide control over device 222 from microcontroller 202 via earlier described line 336 and the high byte enable (HBEN) input thereto is provided from the microcontroller 202 via line 330. A digital output from converter 222 is provided, as earlier described, via 8 lead databus 228 to microcontroller 202.

Figure 9:
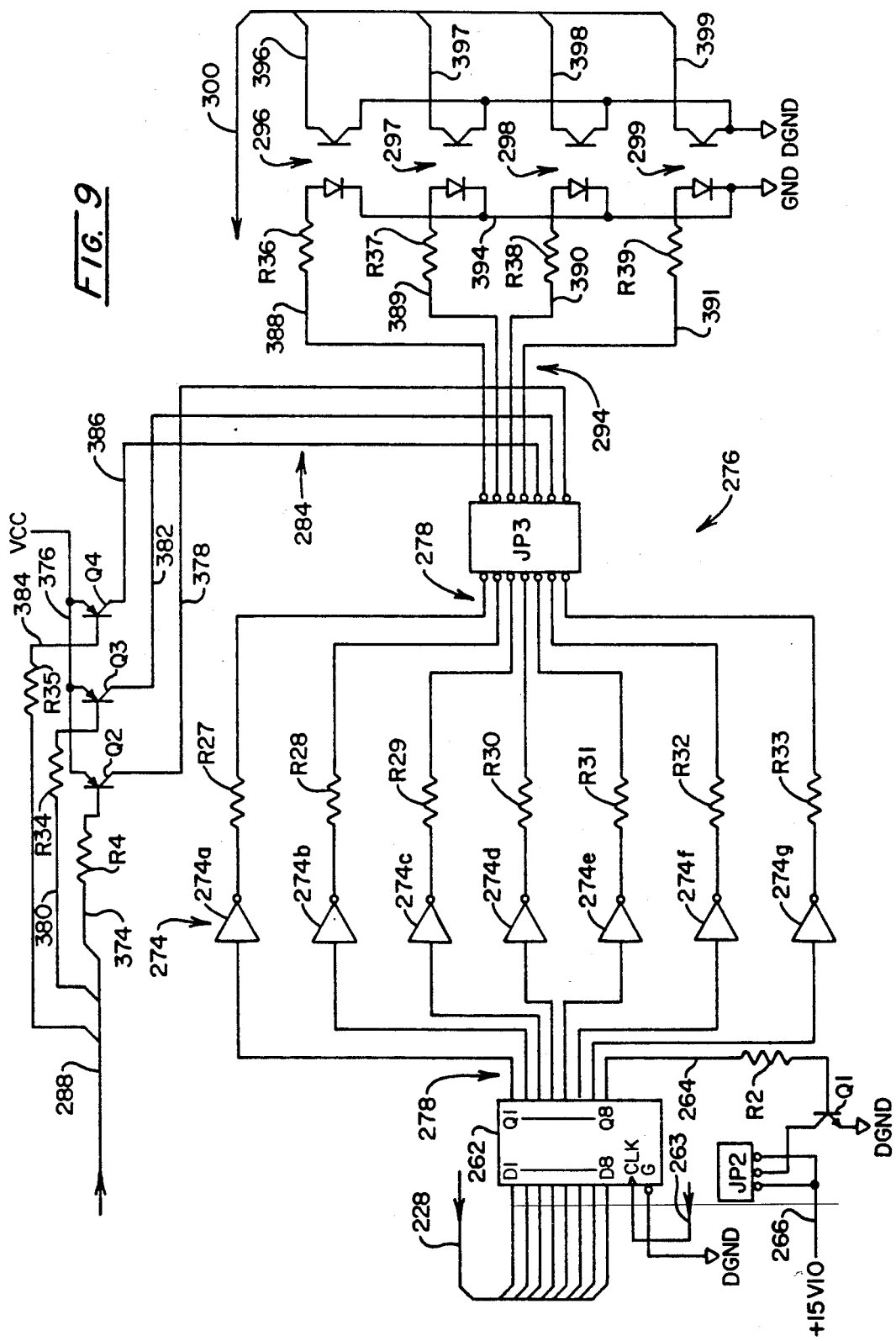
FIG. 9 is a circuit drawing of the input and output driver components of the circuit of FIG. 5.
Figure 10:
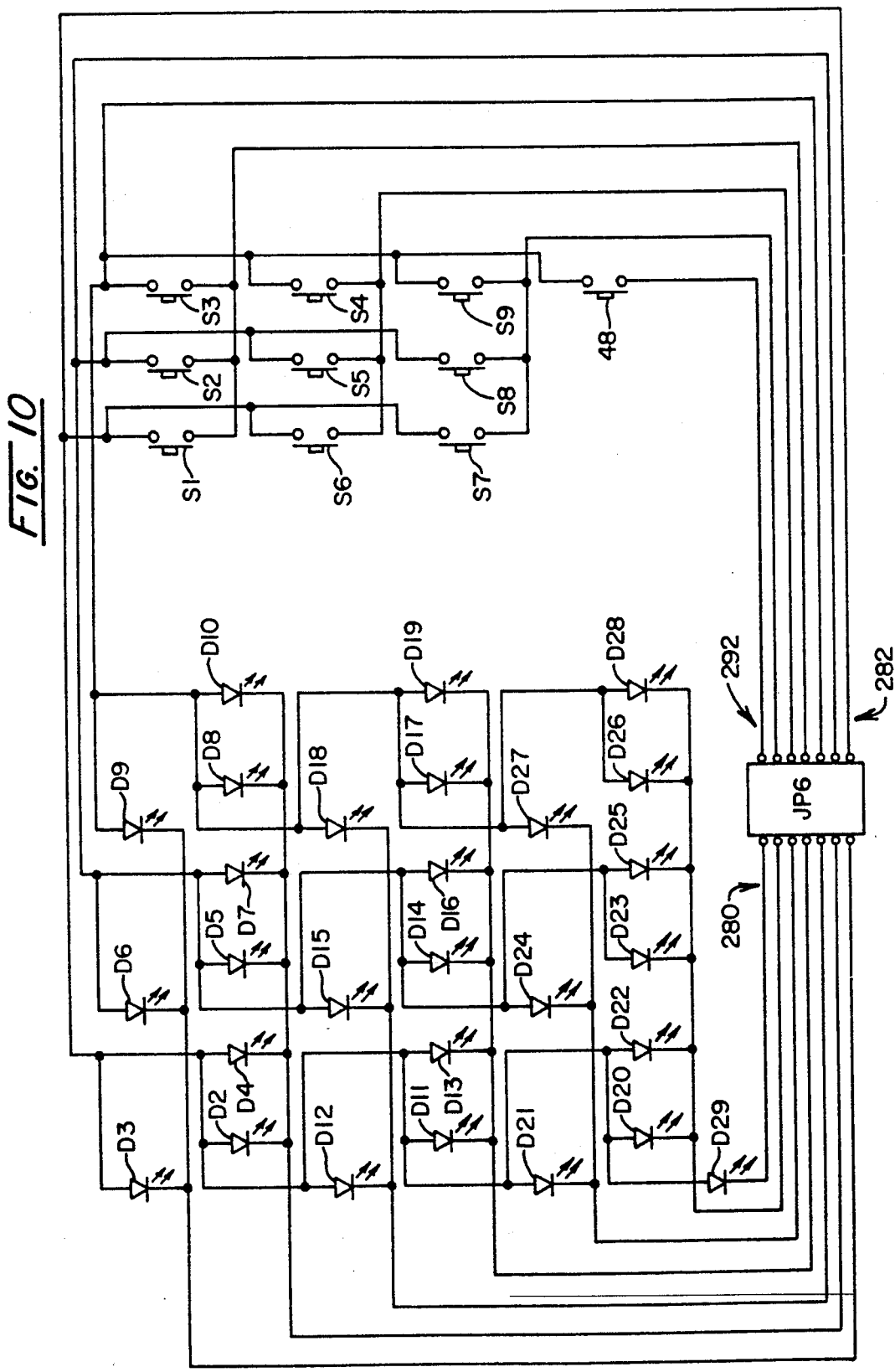
FIG. 10 is a circuit drawing showing the switches and light emitting diodes associated in driven relationship with the circuit of FIG. 9.

FIGS. 9 and 10 should be considered together. In this regard, the headers or connectors JP3 and JP6 are interconnected with pin by pin numbering identity. Thus, line array 278 as seen in FIG. 9 extends through connector JP3 to connector JP6 to develop earlier-described line array 280. In similar fashion, the four line leads 294 leading to header or connector JP3 extend to a corresponding four line lead array 292 in FIG. 10 and the three line array 284 at FIG. 9 extends to the corresponding three line array 282 in FIG. 10. Looking to FIG. 9, the selection of which LEDs are to be energized for illumination as well as whether an audible tone is to be developed by piezoelectric device 268 (FIG. 5) is developed by microcontroller 202 and asserted via databus 228 to the D1-D8 inputs of latch 262. These data are latched by the write output at line 263 from microcontroller 202 which is directed to the clock input of latch 262. The resulting selection output is present at seven line bus array again represented at 278 as well as earlier-described line 264 which extends, as earlier described, through base resistor R2 to NPN transistor Q1. Header JP2 again is reproduced in the drawing as in the case of FIG. 5. Seven line array 278 is seen directed to a seven input sink driver represented generally at 274 and shown in the instant figure as including components 274a-274g. Devices 274a-274g are low true and sink current to ground through respective resistors R27-R33. As may be observed in FIG. 10, each of the drivers 274a-274g is coupled to three sets of light emitting diodes located at panel 42. This connection, as earlier described, is represented by seven lead array 280. FIG. 10 shows that the LED combinations under the control of the drivers at array 274 include the red emitting LED grouping D3, D6, and D9. The next grouping includes green emitting LEDs D2, D4, D5, D7, D8, and D10. Next in the array are three red region emitting LEDs D12, D15, and D18. The next sequential grouping includes green region emitting LEDs D11, D13, D14, D16, D17, and D19. Following the above, a grouping of three red region emitting LEDs is provided at D21, D24, and D27. The final green region emitting LED grouping includes diodes D20, D22, D23, D25, D26, and D28. Finally, red region emitting system fail diode D29 is provided.

Returning to FIG. 9, the current sourcing for the above-noted light emitting diodes is shown under the control of microcontroller 202 via three lead bus 288. The initial source component is again reproduced as PNP transistor Q2, the base of which is coupled via lead 376 and the base resistor R4 with bus 288. The emitter of transistor Q2 is coupled to VCC source via line 376 and its collector is coupled with connector JP3 via lead 378 of array 284. In similar fashion, the base of PNP transistor Q3 is coupled to lead 380 of array 288 which incorporates a base resistor R34. The emitter of transistor Q3 is coupled with VCC through line 376 and the collector thereof is coupled with lead 382 of array 284 extending to connector JP3. Finally, the base of PNP transistor Q4 is coupled with lead 384 incorporating base resistor R35 and representing the third lead of bus 288. The emitter of transistor Q4 is coupled with source VCC via line 376 and the collector thereof is coupled with connector JP3 via lead 386 of array 284. Thus, by appropriate logic applied to bus components 288 and 228, the microcontroller 202 carries out the select and intermittent energization of the light emitting diodes at panel 42 at a rate selected to provide for visual persistency.

The intermittent current sources supplied from transistors Q2-Q4 also serve to monitor the reset switches at panel 42. Looking again to FIG. 10, these switches are identified at S1-S9 and, additionally, system reset switch 48. In addition to source current logic applied from array 282, the switches are monitored from lead array 292 which, in turn, is coupled through headers JP6 and JP3 to provide outputs at lead array 294 as seen in FIG. 9. In FIG. 9, array 294 is seen to be comprised of leads 388-391 carrying respective base resistors R36-R39 which, in turn, serves in conjunction with line 394 to selectively energize and illuminate the light emitting diodes of respective opto-couplers 296-299. These couplers 296-299 may be provided, for example, as type 4N37 marketed by Motorola, Inc. The output of optocouplers 296-299 are provided, respectively, at lines 396-399 forming four lead bus 300 which, in turn, is directed to microcontroller 202 (FIG. 7).

Figure 11:
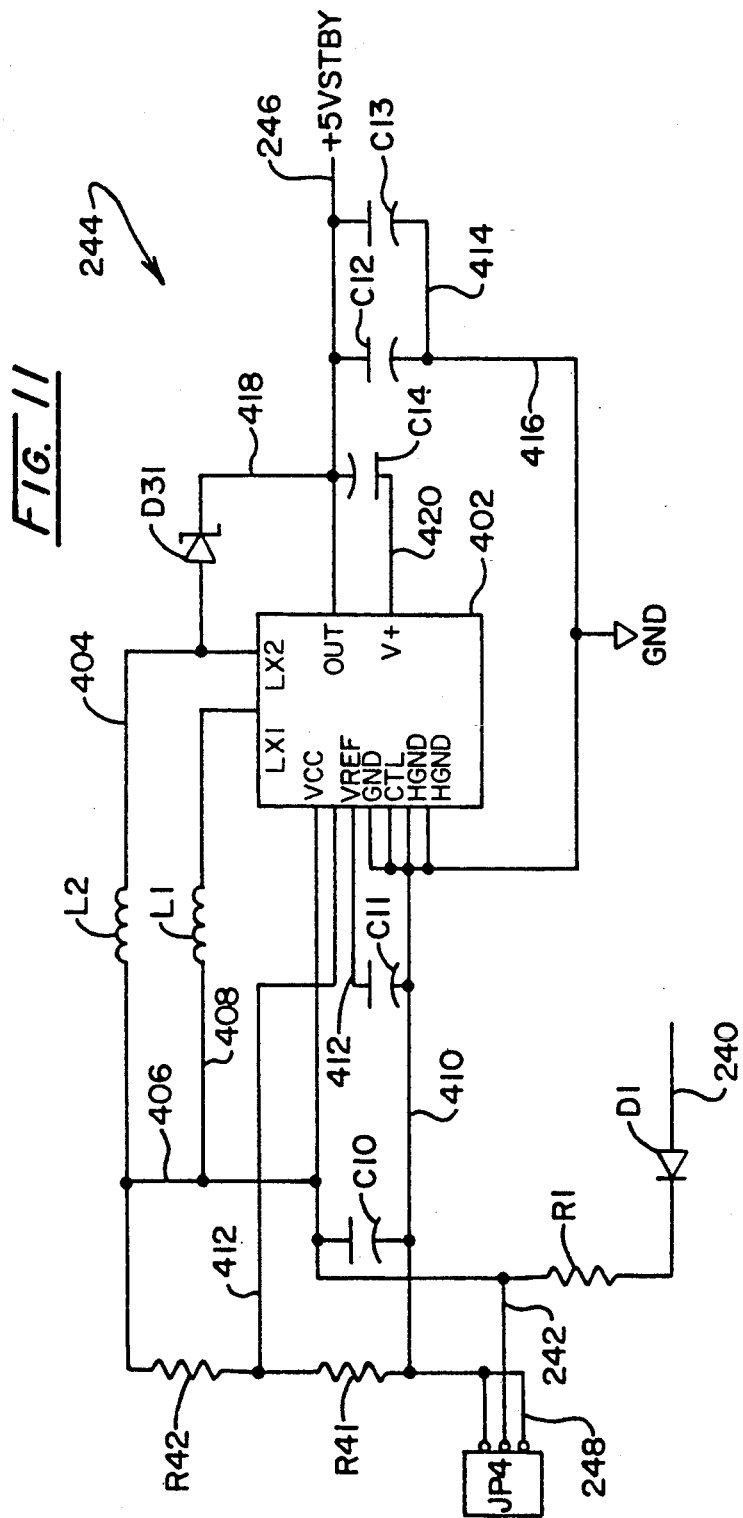
FIG. 11 is a circuit diagram of a stand-by power system employed with the circuit of FIG. 5.

Referring to FIG. 11, the +5 v standby circuit discussed at converter 244 in conjunction with FIG. 5 is revealed in enhanced detail. As before, charging voltage is provided from line 240 through diode D1, resistor R1, and line 242 to header or connector JP4. The latter header is coupled to the batteries as described in the earlier figure. Line 240 is seen to extend additionally to the VCC input of a d.c.-to-d.c. converter represented generally at 244, the principal component of which is converter 402. This converter 402 may be provided, for example, as a type MAX655CPO marketed by Maxim, Inc. Converter 402 performs in conjunction with a main inductor L2 positioned within line 404 extending between the LX2 terminal of device 402 and line 406. Similarly, a secondary inductor L1 is provided extending from the LX1 terminal of device 402 and line 406. A capacitor C10 coupled between line 240 and line 410 is, in effect, across the batteries and serves to buffer them, and a voltage divider network comprised of resistors R41 and R42 provides a signal at line 412 which may be employed for determining instantaneous battery voltage.

A capacitor C11 within line 412 provides a filtering function and the output of device 402 at line 246 is filtered by capacitors C12 and C13 respectively within lines 414 and 416 extending to ground. A Shottky diode D31 is coupled within line 418 between output line 246 and terminal LX2 and, finally, a capacitor C14 within line 420 filters a transistor internal to component 402.

Referring to FIG. 12, an overall generalized flow chart of the activities undertaken by microcontroller 202 is portrayed. As represented at block 440 in the chart, upon start-up, an initialization procedure is undertaken which involves such tasks as resetting the analog-to-digital converter 222, setting all light emitting diodes to a known state which will provide for an output in the green spectral region. Additionally, a 4.9 second time-out period is initiated during which period the panel outputs are not activated and various voltages are permitted to be developed and stabilized. The program then continues as represented at line 442 and block 444 to a routine wherein the input voltages are checked for their conformance with specifications. The program then continues as represented at line 446 and block 448 at which time the control updates the multiplexer 346 and performs any changes in the light emtiting diode outputs at panel 42. As represented at line 450 and block 452, the status of panel 42 switches S1-S9 and 48 is determined, the inputs from their monitoring being read. Following this procedure, as represented at line 454 and block 456, miscellaneous system functions are carried out as are detailed later herein. In the event the system is not powered down, then as represented at line 458, the program loops to block 444 and continues to cycle.

Looking to FIG. 13 the voltage monitoring activities carried out as described in general in conjunction with block 444 are shown at an enhanced level of detail. This routine will loop eight times in carrying out the monitor of each of the seven specification mandated voltages as well as the 5 v stand-by voltage. The sub-routine is entered at line 442 as reproduced from FIG. 12 which is seen leading to the instructions at block 466 providing for the reading of data developed by A/D converter 222. Then, as represented by line 468 and block 470, the microcontroller initiates the conversion activities of the converter 222 for the next voltage channel to be monitored. Then, as represented by line 472 and block 474, a delay, for example of 10 microseconds ensues and, as represented at line 476 and block 478, multiplexer 346 is incremented to a next voltage monitoring channel. The routine then continues as represented by line 480 in block 482 to determine whether the access voltage value is in excess of specification. If it is, then as represented by line 484 and block 486, a warning flag is set for the purpose of carrying out the illumination of a red region emitting LED and turning off the corresponding green region emitting LED pair at panel 42 for the channel at hand. The routine then continues as represented at line 488. In the event of a negative determination at block 482, then as represented at line 490 and block 492, a determination is made as to whether the accessed voltage value is below specification. In the event that it is, then as represented at lines 494 and 484, the warning flag again is set as represented at block 486 and the program progresses as represented at line 488. Where the determination at block 492 is in the negative, then as represented at line 496, the routine progresses to the inquiry at block 498 inquiring as to whether the channel has been sampled and the last conversion is recognized. In the event that it is not, then the routine loops as represented at line 500 to evaluate the next channel. In the event of an affirmative determination, then the routine continues to the main processing loop as represented at line 446 which is again reproduced from FIG. 12.

Figure 14:
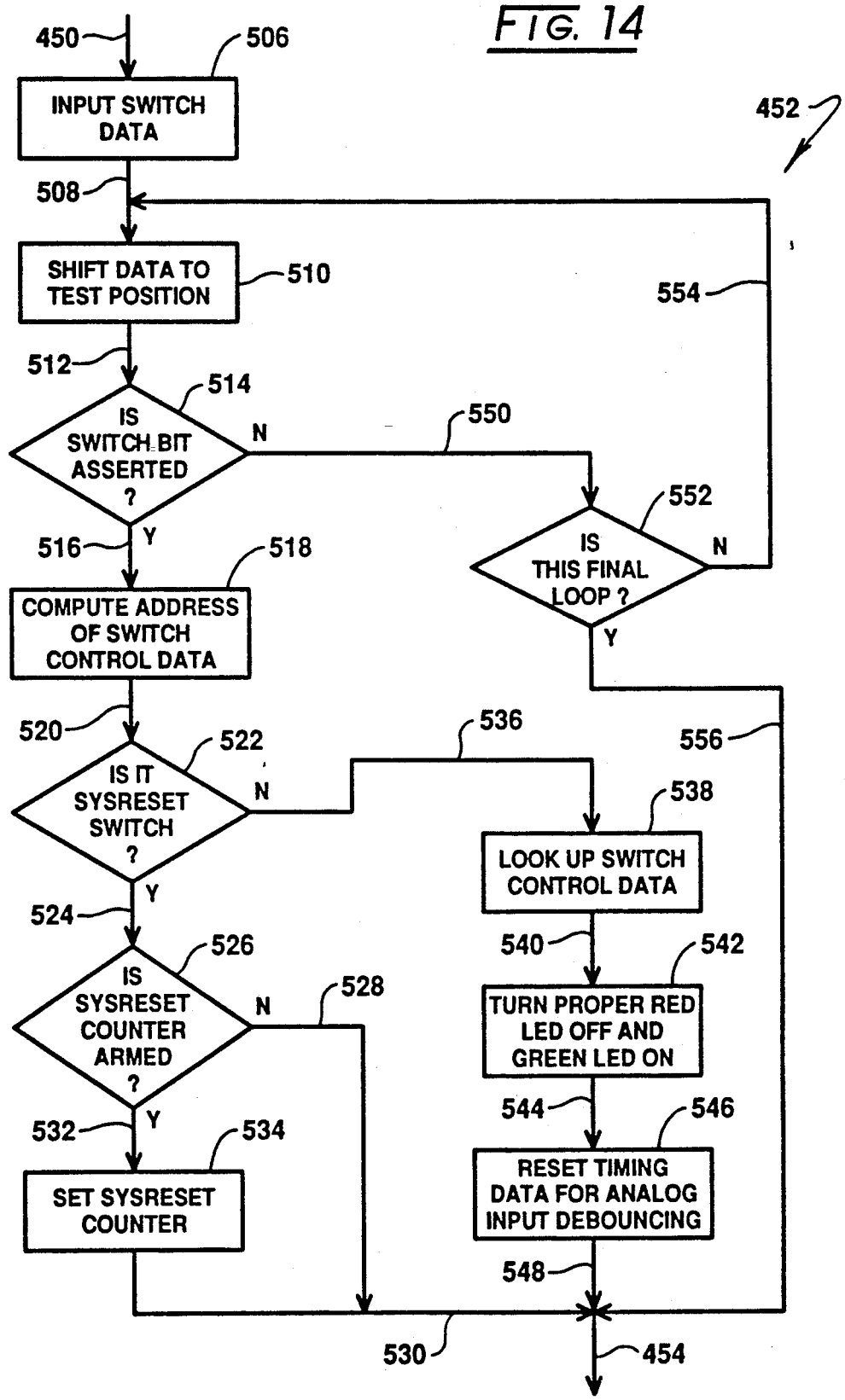
FIG. 14 is a flow chart showing a routine employed for reading switch inputs as shown in the program of FIG. 12.

Referring to FIG. 14, the switch reading routine described in conjunction with block 542 in FIG. 12 is revealed at an enhanced level of detail. This routine is entered as described in the latter figure at line 450 with the instructions at block 506 calling for the inputting of switch data. Such data includes the four bits of information representing the output of opto-isolators 296-299 at four lead bus 300, the information, when combined with the activity states of transistors Q2-Q4, permits a switch identification. The program then continues as represented at line 508 and block 510, whereupon the data so developed are shifted to a test position which may be provided as the carry bit of microcomputer 202. As each such bit is shifted, as represented at line 512 and block 514, a determination is made as to whether the switch represented by the bit has been asserted. If that is the case, then as represented at line 516 and block 518, the routine then determines which switch condition of a possible 12 conditions which may be handled by the circuit is represented as an actuation. A look-up table with 12 possible entries is employed for the purpose of determining this switch identification. For the embodiment shown, nine conditions are developed as a consequence of an actuation, including the output of the air flow sensor 120. Upon identification of the switch or air flow sensing function, the routine progresses as represented by line 520 and block 522 to determine whether the identified switching function results from the actuation of system reset switch 48. In the event of an affirmative result, as represented at line 524 and block 526, a determination is made as to whether the system reset counter has been armed. In general, the system reset counter carries out a software debouncing of the switch 48. However, because of the nature of the system reset signal, which is a 200 millisecond pulse, it is necessary that during the interval of that pulse signal, any additional switch actuation must be ignored. In the same light, holding the switch 48 in an actuating orientation for an interval longer than the noted 200 milliseconds will not generate additional 200 millisecond reset pulses. Thus, in the event that the counter is not armed, as represented at lines 528, 530, and 454, the routine exits. On the other hand, with an affirmative determination at block 526, then as represented at line 532 and block 534, the system reset counter is set.

Where the determination at block 514 is that the system reset is not asserted and that an out of tolerance switch such as S1-S9 or the air flow sensor 120 output has been identified, then as represented at line 536 and block 538, the location of the alarm flag corresponding therewith is looked up from within a table, and as represented at line 540 and block 542, the appropriate LED then flashing with red light is turned off and the corresponding green pair of LEDs are energized.

The routine then continues as represented at line 544 and block 546 where the timing data for analog input debouncing is reset. An out-of-tolerance condition with respect to the specification mandated voltages is required to exist for a certain time interval. This interval may be varied with respect to the desires of the user. It is generally desired that the interval be selected as about 20 milliseconds, a time corresponding with the hold up intervals associated with the power supplies with a loss of power. In general, a form of software filter, counting successive out-of-tolerance measurements, functions to increment a counter to establish the interval. Following the resetting of timing data, as represented at lines 548 and 454, the routine exits.

Where the inquiry at block 514 indicates that a switch bit has not been asserted, then as represented by line 550 and block 552, a determination is made as to whether this is the final loop, i.e. whether the fourth bit has been examined. If it has not been so examined, then as represented at line 554, the routine loops to carry out the shifting of a next bit for testing. Where the final loop has been encountered, then as represented at lines 556 and 454, the routine exits and the general program continues.

Figure 15:
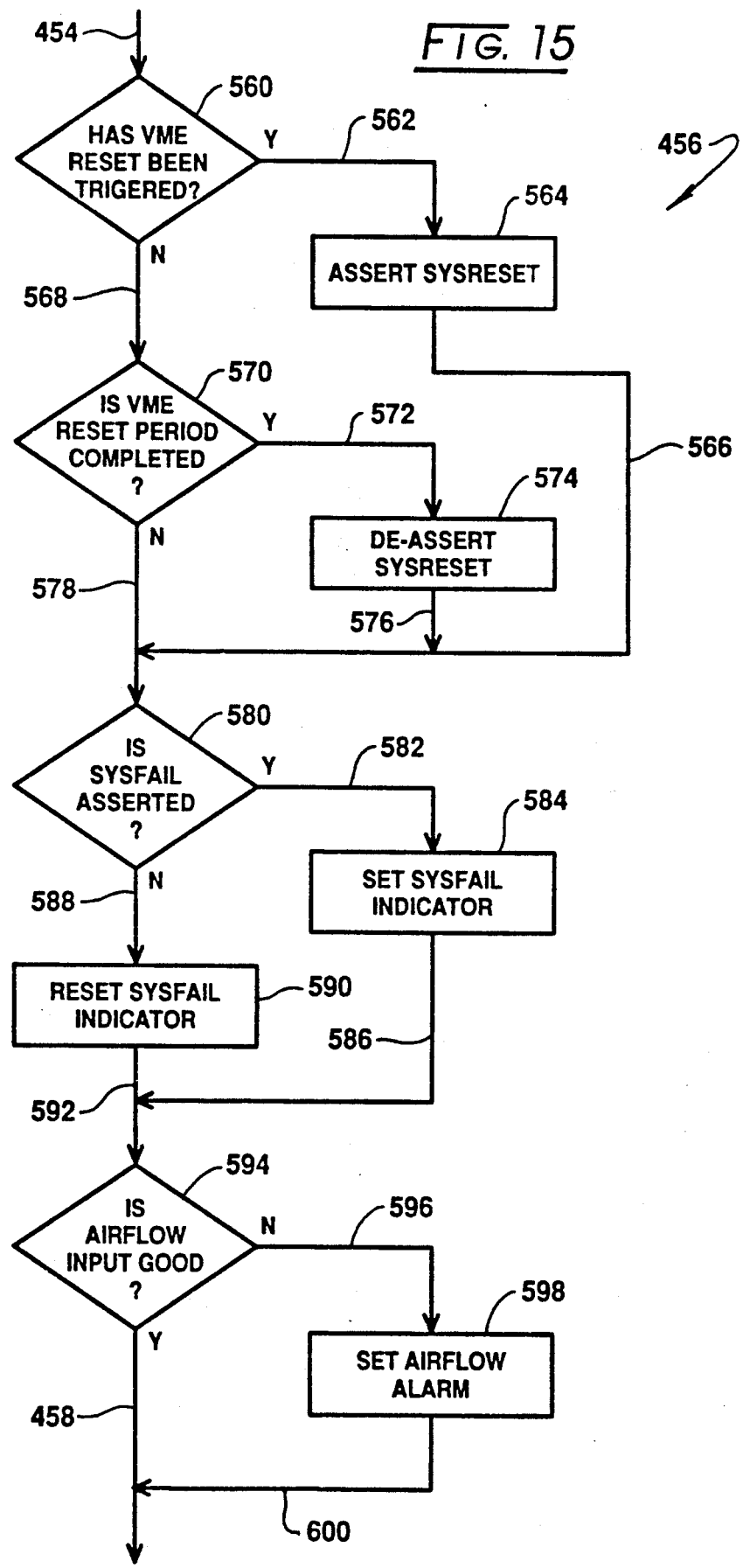
FIG. 15 is a flow chart of a routine carrying out miscellaneous system functions as represented in the program flow chart of FIG. 12.

Referring to FIG. 15, the carrying out of miscellaneous system functions as referred to in the general flow chart of FIG. 12 at block 546 is protrayed at an enhanced level of detail. As before, this routine is entered as represented at line 454 leading to the inquiry at block 560. The inquiry at block 60 determines whether or not the VME reset system (SYSRESET) has been triggered as determined in connection with block 452. This, it will be recalled, is occasioned with the pushing of switch 48. In the event of an affirmative determination, then as represented at line 562 and block 564, the system reset (SYSRESET) is asserted for the noted 200 millisecond interval. The routine then continues as represented at line 566.

Where the inquiry at block 560 is in the negative, then the routine progresses as represented at line 568 wherein the routine will require the completion of the 120 millisecond reset interval. Where that interval is completed, then as represented at line 572 and block 574, the system reset is de-asserted and the routine continues as represented at lines 576 and 566. Where the reset interval is not complete, then as represented by line 578 and block 580, a determination is made as to whether a system fail signal has been received from the back plane 128. In the event that it has been asserted, then as represented at line 582 and block 584, the system fail (SYSFAIL) indicator is illuminated or set. It may be recalled that this indicator is provided as diode D29 at location 50 shown in FIG. 1.

Where the inquiry at block 580 is in the negative, then as represented by line 588 and block 590, the system fail indicator is reset and the routine continues as represented by line 592 to the inquiry at block 594. This inquiry determines whether or not a proper flow of air has been detected by air flow sensor 120. In the event that it has not, then as represented at line 596 and block 598, the air flow alarm represented as the actuation of an appropriate light emitting diode and the energization of transducer 268 is called for. It may be recalled that the light emitting diode is mounted at front panel region 46. The routine then exits as represented at lines 600 and 458.

Since certain changes may be made in the above-described apparatus without departing from the scope of the invention herein involved, it is intended that all matter contained in the description thereof or shown in the accompanying drawings shall be interpreted as illustrative and not in a limiting sense.

I claim:
1. An enclosure of a variety operationally retaining generally planar electronic modules, comprising:
    a housing having front, side and rear portions;
    a back plane mounted rearwardly within said housing, having a plurality of spaced electrical connectors, each configured for receiving a said electronic module in a generally vertical orientation;
    an air intake formed within said housing;
    at least one fan mounted within said housing and energizable to draw air along a path extending from said air intake and in thermal exchange across the surfaces of said electronic modules;
    an air flow sensor mounted in said housing within said path at a location intercepting said air subsequent to its passing across said electronic modules and having a first output condition in the absence of an acceptable air flow thereacross;
    an air flow status indicator mounted at said housing front portion, responsive to input signals to provide a perceptible output representing the output condition of said air flow sensor; and
    control means responsive to said air flow sensor first output condition for deriving a said input signal to provide said perceptible output representing the absence of an acceptable air flow.

2. The enclosure of claim 1 in which:

said air flow sensor provides a second output condition in the presence of an acceptable air flow thereacross; and said control means is responsive to said second output condition for deriving a said input signal to provide said perceptible output representing the presence of an acceptable air flow.

3. The enclosure of clam 2 in which:

said air flow status indicator comprises a source of illumination energizable in a first region of the visible spectrum representing said absence of acceptable air flow, and is energizable in a second region of the visible spectrum representing said presence of an acceptable air flow;

including air flow reset switch means mounted upon said housing and actuable to derive an air flow reset condition; and said control means is responsive to said air flow reset condition to respond to a next occurring said first and second output condition for deriving a next said input signal.

4. The enclosure of claim 1 including:

an alarm transducer mounted within said housing and responsive to an alarm drive input for generating an acoustically perceptible output; and said control means is responsive to said first output condition for deriving said alarm drive input.

5. An enclosure of a variety operationally retaining electronic modules requiring power sources of specified voltage levels comprising:

a housing having a front portion, a side portion, and a rear portion;

a back plane mounted rearwardly within said housing having a sequence of spaced electrical connectors, each configured for receiving a said electronic module and having power source input components for selective electrical communication with said electronic modules through said electrical connectors;

a first power source mounted within said housing having outputs for providing discrete power source outputs corresponding with said specified voltage levels electrically coupled with said power source input components;

a supervisory panel mounted at said housing front portion and having a voltage status indicator responsive to input signals to provide a perceptible output representing the status of voltage levels of said discrete power source outputs; and control means including programmable memory means for retaining values for said specified voltage levels and tolerances associated therewith, responsive to said discrete power source outputs and to corresponding said memory retained values for deriving a said input signal representing an acceptable voltage stage when said discrete power source output exhibits a voltage of value corresponding with a said specified voltage level and deriving a said input signal representing an unacceptable voltage state when said discrete power source output exhibits a voltage of value not corresponding with said specified voltage level.

6. An enclosure of a variety operationally retaining electronic modules requiring power sources of specified voltage levels comprising:

a housing having a front portion, a side portion, and a rear portion;

a back plane mounted rearwardly within said housing having a sequence of spaced electrical connectors each configured for receiving a said electronic module and having power source input components for selective electrical communication with said electronic modules through said electrical connectors;

a first power source mounted within said housing having discrete power source outputs corresponding with said specified voltage levels electrically coupled with said power source input components;

channel reset switch means mounted at said supervisory panel and selectively actuable to derive a reset condition corresponding with a select said discrete power source;

a supervisory panel mounted at said housing front portion and having a voltage status indicator responsive to input signals to provide a perceptible output representing the status of voltage levels of said discrete power source outputs; and control means responsive to said discrete power source outputs for deriving a said input signal representing an acceptable voltage state when a said discrete power source output exhibits a voltage of value corresponding with a said specified voltage level and deriving a said input signal representing an unacceptable voltage state when a said discrete power source output exhibits a voltage of value not corresponding with said specified voltage level, and said control means being responsive to said reset condition to respond to said select discrete power source and derive a next said input signal corresponding therewith.

7. An enclosure of a variety operationally retaining electronic modules requiring power sources of specified voltage levels comprising:

a housing having a front portion, a side portion, and a rear portion;

a back plane mounted rearwardly within said housing, having a sequence of spaced electrical connectors each configured for receiving a said electronic module and having power source input components for selective electrical communication with said electronic modules through said electrical connectors;

a first power source mounted within said housing having discrete power source outputs corresponding with said specified voltage levels electrically coupled with said power source input components;

a supervisory second power source mounted within said housing and having a standby output corresponding with a predetermined voltage level;

a supervisory panel mounted at said housing front portion and having a voltage status indicator responsive to input signals to provide a perceptible output representing the status of voltage levels of said discrete power source outputs;

control means responsive to said discrete power source outputs for deriving a said input signal representing an acceptable voltage state when a said discrete power source output exhibits a voltage of value corresponding with a said specified voltage level and deriving a said input signal representing an unacceptable voltage state when said discrete power source output exhibits a voltage of value not corresponding with said specified voltage level; and coupline means electrically coupling said standby output in powering relationship with said control means.

8. The enclosure of claim 7 including:

a standby rechargeable battery source mounted within said housing; and said coupling means is connected in charging relationship with said battery source.

9. The enclosure of claim 8 in which:

said battery is mounted at said supervisory panel; and said supervisory second power source includes a d.c. to d.c. converter coupled in power supply relationship with said battery for deriving said predetermined voltage level.

10. The enclosure of claim 7 including:

a standby voltage status indicator mounted at said supervisory panel, responsive to input signals to provide a perceptible output representing the status of said standby output predetermined voltage level; and said control means is responsive to said standby output for deriving said input signals representing an acceptable voltage level when said standby output exhibits a voltage of value corresponding with said voltage level, and deriving a said input signal representing an unacceptable voltage level when said standby output exhibits a voltage of value not corresponding with said predetermined voltage level.

11. An enclosure of a variety operationally retaining electronic modules requiring power sources of specified voltage levels comprising:

a housing having a front portion, a side portion, and a rear portion;

a back plane mounted rearwardly within said housing, having a sequence of spaced electrical connectors each configured for receiving a said electronic module and having power source input components for selective electrical communication with said electronic modules through said electrical connectors;

a first power source mounted within said housing having discrete power source outputs corresponding with said specified voltage levels electrically coupled with said power source input components;

a supervisory panel mounted at said housing front portion and having a voltage status indicator responsive to input signals to provide a perceptible output representing the status of voltage levels of said discrete power sources voltages;

an air intake formed within said housing;

at least one fan mounted rearwardly within said housing and energizable to draw air along a path extending from said air intake and in thermal exchange across the surface of said electronic modules;

air flow sensor means mounted in said housing within said path, having a first output condition in the absence of an acceptable air flow thereacross and having a second output condition in the presence of an acceptable air flow thereacross;

an air flow status indicator mounted at said supervisory panel, responsive to said output signals to provide perceptible outputs representing said first and second output conditions;

control means responsive to said discrete power source outputs for deriving a said input signal representing an acceptable voltage state when a said discrete power source output exhibits a voltage of value corresponding with a said specified voltage level and deriving a said input signal representing an unacceptable voltage state when said discrete power source output exhibits a voltage of value not corresponding with said specified voltage level, said control means being responsive to said air flow sensor first and second output conditions to derive said input signals to provide said perceptible outputs selectively representing said first and second output conditions.

12. An enclosure of a variety operationally retaining electronic modules requiring power sources of specified voltage levels, comprising:

a generally rectangular housing having a hand accessible front portion, spaced apart side portions and a rear portion defining the periphery of an enclosure;

a back plane mounted rearwardly within said enclosure having a sequence of spaced electrical connectors, each configured for receiving a said electronic module;

a power supply mounted within said housing having discrete power source outputs corresponding with said specified voltage levels and connectable with said modules through said back plane;

a card cage within said housing having first and second spaced, parallel arrays of support members for vertically supporting said modules in adjacency with said back plane;

an air flow plenum region within said enclosure located adjacent said first array of support members;

an air flow receptor region within said enclosure located adjacent said second array of support members;

intake port means comprising two regions of openings, one said region of openings being disposed within each of said spaced apart housing side portions and substantially coextensive with said air flow plenum region, for receiving air as the commencement of an air path directed to said air flow plenum, thence, in turn, through said card cage and said air flow receiving region;

air filter means comprising two elongate air filters, each vertically oriented and slideably mounted adjacent one of said two regions of openings and hand accessible for replacement from said front portion, for effecting removal of contaminants from air entering said air path; and fan means mounted upon said housing for drawing air through said input port means, thence along said air path and outwardly from said housing enclosure.

13. An enclosure of a variety operationally retaining electronic modules requiring power sources of specified voltage levels, comprising:

a generally rectangular housing having a hand accessible front portion, spaced apart side portions and a rear portion defining the periphery of an enclosure, said spaced apart side portions comprising two, spaced apart side plates, each having a plurality of access openings for providing access to internal components within said housing;

a back plane mounted rearwardly within said enclosure having a sequence of spaced electrical connectors, each configured for receiving a said electronic module;

a power supply mounted within said housing having discrete power source outputs corresponding with said specified voltage levels connectable with said modules through said back plane;

a card cage within said housing having first and second spaced, parallel arrays of support members for vertically supporting said modules in adjacency with said back plane;

an air flow plenum region within said enclosure located adjacent said first array of support members;

an air flow receptor region within said enclosure located adjacent said second array of support members;

intake port means including an elongate region of intake port openings within each said spaced apart side plate and located substantially coextensively with said air flow plenum region for receiving air as the commencement of an air path directed to said air flow plenum, thence, in turn, through said card cage and a said air flow receiving region;

said housing spaced apart side portions further including two enclosing cover panel members each being removably attached to one of said side plates and configured for covering said access openings therein to enclose said air path and having port openings therein adjacent said elongate region of intake port openings;

air filter means positioned over said intake port means within said housing and hand accessible for replacement from said front portion, for effecting removal of contaminants from air entering said air path; and fan means mounted upon said housing for drawing air through said input port means, thence along said air path and outwardly from said housing enclosure.

14. The enclosure of claim 13 including baffle means mounted upon said housing at said air flow plenum region for diverting a portion of air within said air path through said card cage at locations adjacent said spaced apart side portions.

15. The enclosure of claim 14 in which said baffle means is configured as an elongate hollow duct extending from said housing rear portion to said front portion and having openings at its front and rear ends for receiving and protectively retaining cable extending from said rear portion to said front portion.

16. An enclosure of a variety operationally retaining electronic modules requiring power sources of specified voltage levels, comprising:

a generally rectangular housing having a hand accessible front portion, spaced apart side portions and a rear portion defining the periphery of an enclosure;

a back plane mounted rearwardly within said enclosure having a sequence of spaced electrical connectors, each configured for receiving a said electronic module;

a power supply mounted within said housing having discrete power source outputs corresponding with said specified voltage levels connectable with said modules through said back plane;

a card cage within said housing having first and second spaced, parallel arrays of support members for vertically supporting said modules in adjacency with said back plane;

an air flow plenum region within said enclosure located adjacent said first array of support members;

an air flow receptor region within said enclosure located adjacent said second array of support members;

intake port means mounted at a said housing side portion for receiving air as the commencement of an air path directed to said air flow plenum, thence, in turn, through said card cage and said air flow receiving region;

air filter means positioned over said intake port means within said housing and hand accessible for replacement from said front portion, for effecting removal of contaminants from air entering said air path;

fan means mounted upon said housing for drawing air through said input port means, thence along said air path and outwardly from said housing enclosure;

a supervisory panel mounted at said housing front portion and having a voltage status indicator responsive to output representing the status of voltage levels of said discrete power source outputs; and control means responsive to discrete power source outputs for deriving an input signal representing an acceptable voltage state when a said discrete power source output exhibits a voltage of value corresponding with a said specified voltage level and having a said input signal representing an unacceptable voltage state when said discrete power source output exhibits a voltage of value not corresponding with said specified voltage level.

17. The enclosure of claim 16 including:

channel reset switch means mounted at said supervisory panel and selectively actuable to derive a reset condition corresponding with a select said discrete power source output;

and said control means is responsive to said reset condition to respond to said select discrete power source output and derive a next said input signal corresponding therewith.

18. A enclosure of a variety operationally retaining electronic modules requiring power sources of specified voltage levels, comprising:

a generally rectangular housing having a hand accessible front portion, spaced apart side portions and a rear portion defining the periphery of an enclosure;

a back plane mounted rearwardly within said enclosure having a sequence of spaced electrical connectors, each configured for receiving a said electronic module;

a power supply mounted within said housing having discrete power source outputs corresponding with said specified voltage levels connectable with said modules through said back plane;

a card cage within said housing having first and second spaced, parallel arrays of support members for vertically supporting said modules in adjacency with said back plane;

an air flow plenum region within said enclosure located adjacent said first array of support members;

intake port means mounted at a said housing side portion for receiving air as the commencement of an air path directed to said air flow plenum, thence, in turn, through said card cage and said air flow receiving region;

air filter means positioned over said intake port means within said housing and hand accessible for replacement from said front portion, for effecting removal of contaminants from air entering said air path;

fan means mounted upon said housing for drawing air through said input port means, thence along said air path and outwardly from said housing enclosure;

an air flow sensor mounted in said housing within said air path at a location intercepting said air within said air path subsequent to its passing through said card cage and having a first output condition in the absence of an acceptable air flow;

an air flow status indicator mounted at said housing front portion, responsive to an input signal to provide a perceptible output representing the first output condition of said air flow sensor; and control means responsive to said air flow sensor first output condition for deriving said input signal to provide said perceptible output representing the absence of an acceptable air flow.

19. The enclosure of claim 18 in which said air flow sensor provides a second output condition in the presence of an acceptable air flow thereacross; and said control means is responsive to said second output condition for deriving a said input signal to provide said perceptible output representing the presence of an acceptable air flow.

* * * * *